United States Patent
de Oliveira et al.

(10) Patent No.: US 9,768,782 B2
(45) Date of Patent: Sep. 19, 2017

(54) ELECTRONIC CIRCUITS

(71) Applicant: Pragmatic Printing Ltd, Sedgefield, Durham (GB)

(72) Inventors: Joao de Oliveira, Longstanton (GB); Scott Darren White, Cambridge (GB); Catherine Ramsdale, Cambridge (GB)

(73) Assignee: Pragmatic Printing Limited, Sedgefield, Durham (GB)

( * ) Notice: Subject to any disclaimer, the term of this patent is extended or adjusted under 35 U.S.C. 154(b) by 0 days.

(21) Appl. No.: 14/905,737

(22) PCT Filed: Jul. 16, 2014

(86) PCT No.: PCT/GB2014/052175
§ 371 (c)(1),
(2) Date: Jan. 15, 2016

(87) PCT Pub. No.: WO2015/008067
PCT Pub. Date: Jan. 22, 2015

(65) Prior Publication Data
US 2016/0173099 A1    Jun. 16, 2016

(30) Foreign Application Priority Data
Jul. 17, 2013    (GB) .................................. 1312809.5

(51) Int. Cl.
*H03K 3/03*    (2006.01)
*H03K 19/0944*    (2006.01)
(Continued)

(52) U.S. Cl.
CPC ......... *H03K 19/0944* (2013.01); *H03K 3/037* (2013.01); *H03K 3/0315* (2013.01);
(Continued)

(58) Field of Classification Search
CPC ................. H03K 5/12; H03K 19/0948; H03K 19/09482; H03K 17/16; H03K 19/0944
(Continued)

(56) References Cited

U.S. PATENT DOCUMENTS

| 4,503,341 A | 3/1985 | Shah | |
| 5,430,335 A * | 7/1995 | Tanoi | H03K 19/09429 327/108 |

(Continued)

FOREIGN PATENT DOCUMENTS

| EP | 0055570 A2 | 7/1982 |
| EP | 0432472 A2 | 6/1991 |

(Continued)

OTHER PUBLICATIONS

International Search Report and Written Opinion of the International Searching Authority, mailed Jan. 5, 2015, for corresponding International Application No. PCT/GB2014/052175, 19 pages.

(Continued)

*Primary Examiner* — Arnold Kinkead
(74) *Attorney, Agent, or Firm* — Klarquist Sparkman, LLP

(57) ABSTRACT

An electronic circuit comprises: an input terminal; an output terminal; first and second supply rails; first, second, third, and fourth field effect transistors, FETs, each of a first type and each having respective gate, source and drain terminals; and first and second loads. The source of the first FET is connected to the first supply rail, the drain of the first FET and the source of the second FET are connected to the output terminal, the drain of the second FET is connected to the second supply rail, the gate of the third FET and the gate of the fourth FET are connected to the input terminal, the drain of the third FET is connected to the second supply rail, the first load is connected between the first supply rail and the (Continued)

source of the third FET, and the second load is connected between the drain of the fourth FET and the second supply rail. In one aspect of the invention, the gate of the first FET is connected to a node between the source of the third FET and the first load such that a voltage at the source of the third FET is applied to the gate of the first FET, and the gate of the second FET is connected to a node between the drain of the fourth FET and the second load such that a voltage at the drain of the fourth FET is applied to the gate of the second FET.

40 Claims, 20 Drawing Sheets

(51) Int. Cl.
    *H03K 17/16*       (2006.01)
    *H03K 3/037*       (2006.01)
    *H03K 3/356*       (2006.01)
    *H03K 19/20*       (2006.01)
    *H03K 23/00*       (2006.01)

(52) U.S. Cl.
    CPC ....... *H03K 3/356017* (2013.01); *H03K 17/16* (2013.01); *H03K 19/09441* (2013.01); *H03K 19/20* (2013.01); *H03K 23/002* (2013.01)

(58) Field of Classification Search
    USPC ...... 327/170, 108, 205, 112; 326/80, 83, 81, 326/85, 82, 91; 331/57, 2, 46, 55
    See application file for complete search history.

(56) References Cited

U.S. PATENT DOCUMENTS

| | | | |
|---|---|---|---|
| 7,385,425 | B1 | 6/2008 | Li et al. |
| 7,663,405 | B2 | 2/2010 | Tam |
| 8,013,633 | B2 | 9/2011 | Luo et al. |

FOREIGN PATENT DOCUMENTS

| | | |
|---|---|---|
| EP | 2221973 A1 | 8/2010 |
| GB | 2272588 A | 5/1994 |
| JP | 58137332 A | 2/1982 |

OTHER PUBLICATIONS

International Preliminary Report on Patentability, mailed Jan. 28, 2016, for corresponding International Application No. PCT/GB2014/052175, 14 pages.

Search Report from the United Kingdom Intellectual Property Office for United Kingdom Application No. GB1312809.5, dated Jan. 9, 2014, 4 pages.

\* cited by examiner

ELECTRONIC CIRCUITS

CROSS REFERENCE TO RELATED APPLICATIONS

This is the U.S. National Stage of International Application No. PCT/GB2014/052175, filed Jul. 16, 2014, which in turn claims the benefit and priority to United Kingdom Application No. GB1312809.5, filed Jul. 17, 2013.

The present invention relates to electronic circuits, and in particular, although not exclusively, to electronic logic circuits, for example for use as building blocks in signal processing circuits and apparatus. Certain embodiments relate to flexible logic circuits.

BACKGROUND

Conventional semiconductor devices and related EDA tools/libraries are mostly based around CMOS logic circuits.

CMOS uses complementary n-type and p-type transistors, and displaced the previous NMOS (n-type) technologies in the 1980s due to better power efficiency, higher noise margin, improved fan-out and easier integration. However, in flexible electronics NMOS is currently state-of-the-art and the lack of robust CMOS capability is a critical issue. In flexible electronics significant effort has been put into both NMOS and PMOS but there is a mismatch in achievable performance (e.g. mobilities). Complementary materials require very different deposition and patterning processes (e.g. solution-deposition vs. vacuum-deposition), thus combining the two into a single manufacturable process is very challenging.

The main building block for digital logic is the inverter. Three main inverter variants of NMOS logic can be implemented.

FIG. 1a shows three prior art implementations of NMOS inverters, and FIG. 1b shows a prior art CMOS inverter. The CMOS inverter flips between the PMOS and NMOS devices being active, such that they complement each other and minimal leakage at 0V.

The three NMOS variants, as illustrated in FIG. 1a, all have benefits and drawbacks (footprint, power efficiency, noise margin), and are used today in "Flexible Electronics" due to the absence of a commercially viable manufacturing route to CMOS. However, this limits the ease of design as well as the degree of integration and complexity that can be achieved. Noise margin dictates the number of logic gates which can be cascaded, i.e. the complexity of the overall circuit. This is sensitive to variations in threshold voltage (the voltage at which the transistor turns-on) and channel-length (as channel-length reduces to minimise footprint the noise margin is lower).

FIG. 2a illustrates that as the variation in threshold voltage ($\square$VT) for PMOS increases the yield of gates (n) drops ($\square$VT~0.15V is a reasonable production benchmark; the same is true for NMOS as PMOS); FIG. 2b illustrates that CMOS (C-TFT) is able to yield significantly higher numbers of gates (stages) than PMOS (P-TFT) even with a relatively large variation in threshold voltage ($\square$VT~0.5V) (see IEEE TRANSACTIONS ON ELECTRON DEVICES, VOL. 53, NO. 4, APRIL 2006 601, "Influence of Transistor Parameters on the Noise Margin of Organic Digital Circuits", Stijn De Vusser, Jan Genoe, and Paul Heremans, and IEEE TRANSACTIONS ON ELECTRON DEVICES, VOL. 57, NO. 1, JANUARY 2010 201, "Noise-Margin Analysis for Organic Thin-Film Complementary Technology", Dieter Bode, Cédric Rolin, Sarah Schols, Maarten Debucquoy, Soeren Steudel, Gerwin H. Gelinck, Jan Genoe, and Paul Heremans).

FIG. 3 illustrates another prior art logic gate implemented in CMOS, namely a NAND gate. Two PMOS transistors are connected in parallel between the output terminal and first supply rail (Vdd), each of these transistors receiving a respective one of inputs A and B. Two NMOS devices are connected in series between the output terminal and a second supply rail (ground, or Vss in this example), each also receiving a respective one of inputs A and B.

BRIEF SUMMARY OF THE DISCLOSURE

It is an aim of certain embodiments of the invention to solve, mitigate or obviate, at least partly, at least one of the problems and/or disadvantages associated with the prior art. Certain embodiments aim to provide at least one of the advantages described below.

Certain embodiments aim to provide electronic building blocks analogous to conventional CMOS building blocks, for incorporation in circuits, for example flexible circuits.

According to a first aspect of the present invention there is provided an electronic circuit, for example a logic circuit, comprising:

an input terminal; an output terminal; a first supply rail; a second supply rail;

a first field effect transistor, FET, of a first type (e.g. having a first polarity, i.e. having a channel of a first polarity) and having respective gate, source and drain terminals;

second, third, and fourth FETs each of said first type and each having respective gate, source and drain terminals;

a first load; and a second load, wherein the source of the first FET is connected to the first supply rail, the drain of the first FET and the source of the second FET are connected to the output terminal, the drain of the second FET is connected to the second supply rail, the gate of the third FET and the gate of the fourth FET are connected to the input terminal, the drain of the third FET is connected to the second supply rail, the first load is connected between the first supply rail and the source of the third FET, the second load is connected between the drain of the fourth FET and the second supply rail, the gate of the first FET is connected to a node between the source of the third FET and the first load such that a voltage at the source of the third FET is applied to the gate of the first FET, and the gate of the second FET is connected to a node between the drain of the fourth FET and the second load such that a voltage at the drain of the fourth FET is applied to the gate of the second FET.

Circuits in accordance with this first aspect may be arranged as inverters and/or may be incorporated in NOR and NAND circuits, also embodying the present invention.

A second aspect provides an electronic circuit comprising: an input terminal; an output terminal; a first supply rail; a second supply rail;

a first field effect transistor, FET, of a first type and having respective gate, source and drain terminals; a second FET of said first type and having respective gate, source and drain terminals; a third FET of said first type and having respective gate, source and drain terminals; a fourth FET of said first type and having respective gate, source and drain terminals; a first load; and a second load, wherein the source of the first FET is connected to the first supply rail, the drain of the first FET and the source of the second FET are connected to the output terminal, the drain of the second FET is connected to the second supply rail, the gate of the third FET and the gate of the fourth FET are connected to the input terminal, the drain of the third FET is connected to the second supply rail, the first load is connected between the first supply rail and the source of the third FET, the second load is connected between the drain of the fourth FET and the second supply rail, the gate of the second FET is connected to a node between the source of the third FET and the first load such that a voltage at the source of the third FET is applied to the gate of the second FET, and the gate of the first FET is connected to a node between the drain of the fourth FET and the second load such that a voltage at the drain of the fourth FET is applied to the gate of the first FET.

Circuits in accordance with this second aspect may be arranged as buffers and/or may be incorporated in NOR and NAND circuits, also embodying the present invention.

It will be appreciated that the "input terminal" may also be described as a first terminal, a first or input node, or simply an input. The "input terminal" is not necessarily a terminal arranged to enable external connection to the circuit. Instead, the term "input terminal" simply means a part of the defined circuit to which a signal (e.g. voltage) may be input. Thus, in certain embodiments, the nominal input terminal may be connected (e.g. permanently) to some other component or portion of a larger circuit of which the defined circuit forms part. Similarly, the "output terminal" may also be described as a second terminal, a second or output node, or simply an output. The output terminal is a part of the defined circuit at which an output signal is developed, and in certain embodiments may be connected to another component or portion of a larger circuit of which the defined circuit forms part. The electronic circuit may also be described as a circuit module.

Further aspects and embodiments are defined by the accompanying claims.

It will be appreciated that certain embodiments of the invention can be described as incorporating 'NCMOS' technology, which is a novel quasi-CMOS design/technology made entirely from NMOS devices, invented by the present inventors. Compared to flexible CMOS, this provides major benefits in terms of manufacture because NMOS processing can be directly applied.

BRIEF DESCRIPTION OF THE DRAWINGS

Embodiments of the invention are further described hereinafter with reference to the accompanying drawings, in which.

DETAILED DESCRIPTION

Figure 1A:
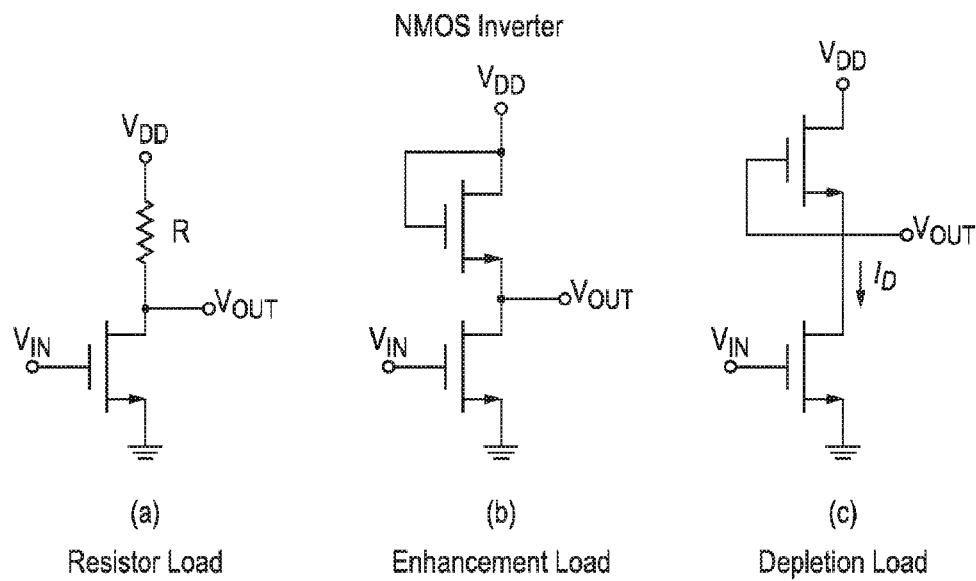
FIG. 1a illustrates three NMOS inverter configurations in accordance with the prior art.
Figure 1B:
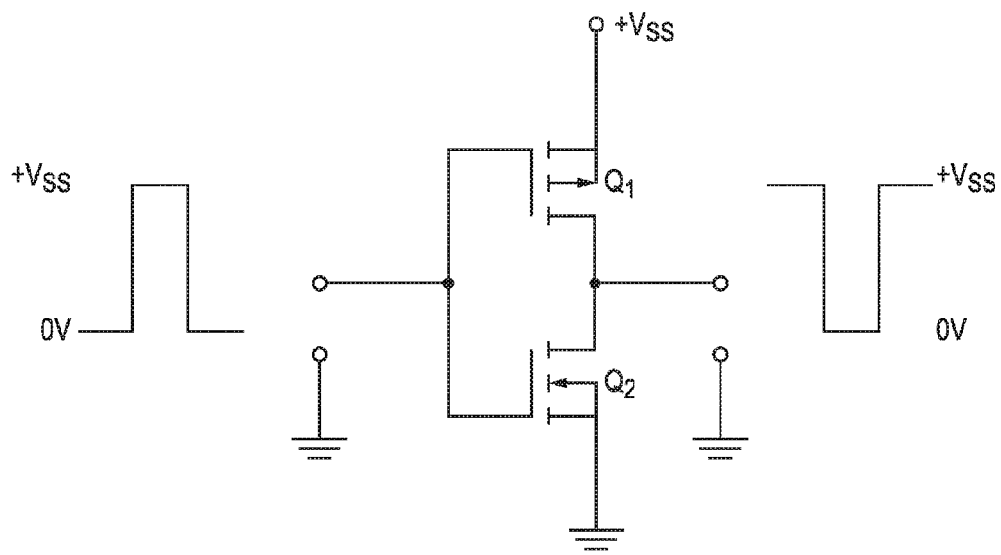
FIG. 1b illustrates a CMOS inverter in accordance with the prior art.
Figure 2A:
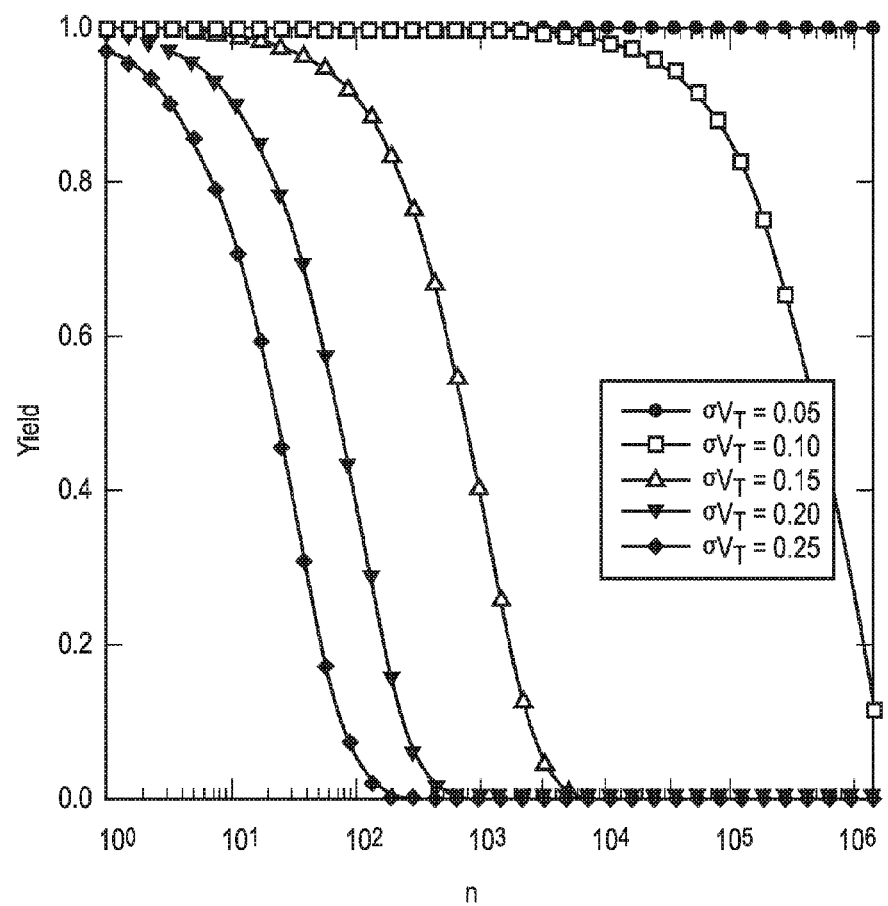
FIG. 2a illustrates the effect of variation in threshold voltage on the yield of gates.
Figure 2B:
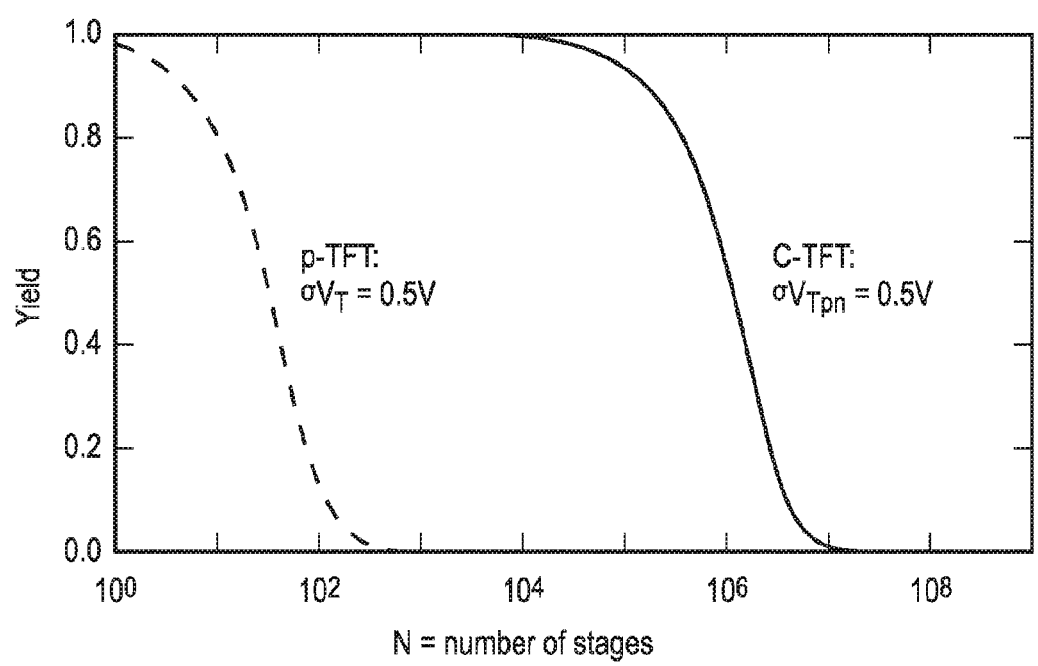
FIG. 2b illustrates the difference between the yield of dates for CMOS and PMOS technologies.
Figure 3:
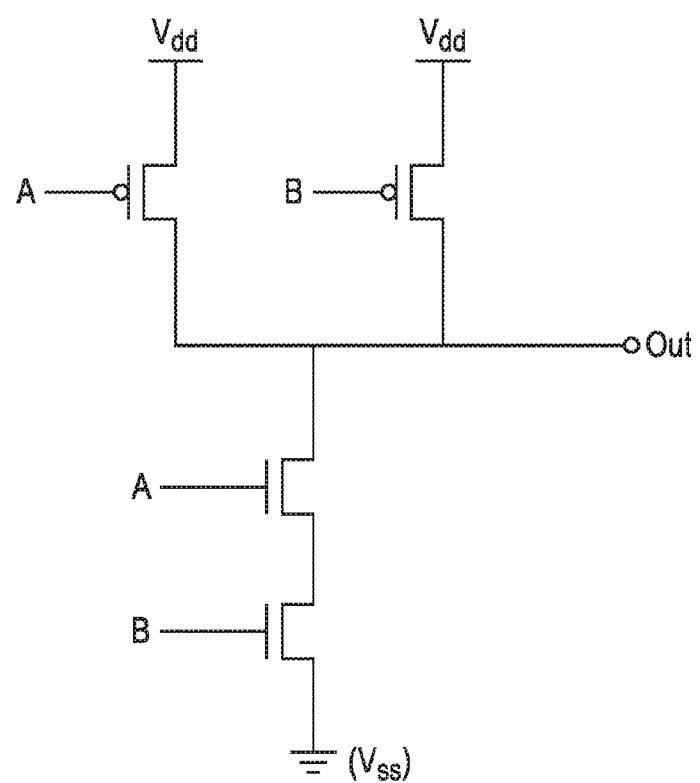
FIG. 3 illustrates a CMOS NAND gate in accordance with the prior art.
Figure 4:
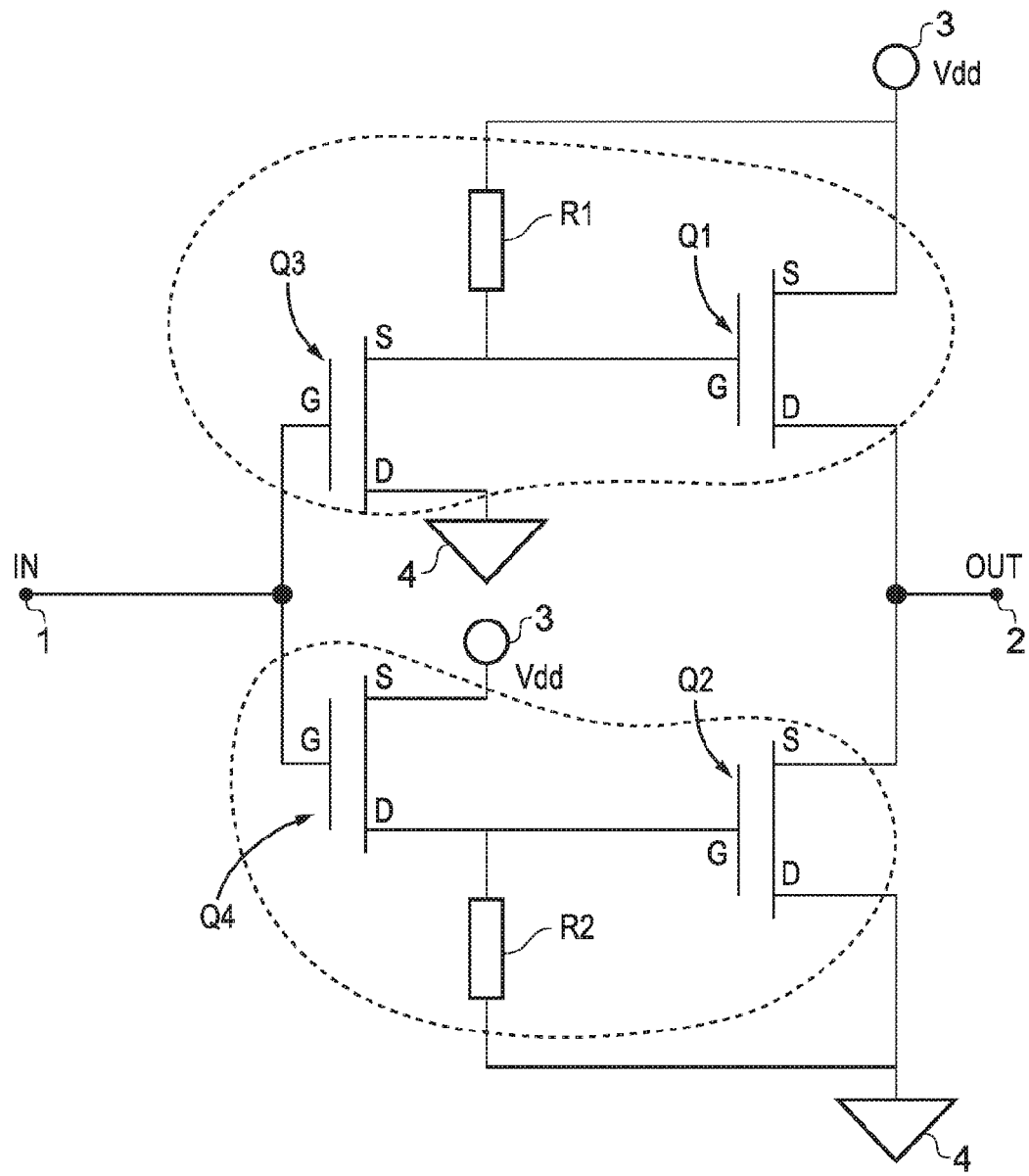
FIG. 4 illustrates an inverter circuit embodying the invention.

FIG. 4 illustrates an inverter embodying the present invention, and incorporating the NCMOS concept/technology invented by the present inventors.

The device comprises four NMOS transistors (Q1, Q2, Q3, and Q4) and two loads R1 and R2, which can also be described as polarising load elements (and can take the form, in certain embodiments, of resistors, N-type enhancement loads or N-type depletion loads). Essentially it is a hybrid between NMOS and CMOS, hence the name NCMOS.

In the terminology of claim 1, Q1 is the first FET, Q2 is the second FET, and so on. The first supply rail 3 is Vdd in this example, and the second supply rail 4 is Vss or ground. Input terminal 1 and output terminal 2 are labelled, and the source, drain, and gate terminals of each of the FETs are labelled, as S, D, and G respectively. The connections between the various terminals are as defined in claim 1. In this example, the respective connections between the source and drain terminals of the first and second FETs Q1, Q2 and the rails and output terminal are direct (i.e. not via another component, device, or circuit element), but in alternative embodiments one or more of the connections may not be direct (e.g. see below and the description of the NAND gate of FIG. 5). Thus, the term "connected" may, in certain embodiments, be interpreted as "coupled", encompassing both direct connection (via no intermediate circuit component) and indirect connection (via one or more intermediate circuit components, including passive devices, such as resistors for example, and/or active devices, such as further FETs for example).

FIG. 4 is a schematic of the NCMOS inverter of this first embodiment. The top three devices/circuit elements (i.e. first and third FETs Q1, Q3 and first load R1, as circled by the upper broken line in the figure) create a "virtual PMOS transistor", using the top left transistor Q3 and its polarising load R1 as an inverter to the switching top-right NMOS transistor Q1. The bottom three devices (second and fourth FETs Q2, Q4 and second load R2, as circled by the lower broken line) are needed to create a NMOS transistor equivalent in switching timing to the top "virtual PMOS transistor". The bottom left transistor Q4 and its polarising load L2 behave as a follower to the switching bottom right NMOS transistor Q2.

The major benefits of the architecture are:

The ability to use existing commercially viable NMOS transistors and processes.

FanOut comparable to CMOS, and better than NMOS (or PMOS).

Noise margin comparable to CMOS, and better than NMOS (or PMOS).

Use existing design and simulation electronic design automation (EDA) tools and libraries, speeding up the possible complexity design of "Flexible Electronics".

Extends to other fundamental building-blocks: NOR, NAND

Can be implemented on any process technology (oxide, organic, n-type, p-type, . . . )

NCMOS matches well with the applicant's planar device technology which is 1000× smaller than other printed logic. The extra devices required for NCMOS is offset by the incredibly small footprint of the planar devices. This provides the applicant with a compelling unique offering for printed logic.

NCMOS brings with it most of the implementation advantages of CMOS (high noise margin and low power consumption) and also enables extensive CMOS modelling libraries to be used once the basic NCMOS design has been modelled, which is a huge benefit over unipolar logic. This will save significant time and cost and accelerates the development of complex logic in flexible electronics. The basic NCMOS building blocks (NOT, NAND, NOR) in certain embodiments are implemented in circuit designs.

From a lifetime perspective NCMOS also has advantages over NMOS because the lower power consumption allows a longer lifetime for battery driven products, which is where many applications for flexible logic reside.

However, there are trade-offs to be made with NCMOS. For example, a NOR gate will require 9 devices in NCMOS whereas the equivalent CMOS needs only 4 and an NMOS block requires only 3. If the higher number of devices leads to increased footprint then throughput will be reduced and costs will increase. Additionally, in simple circuits, NMOS yield may outweigh the NCMOS yield because complexity is not an issue and the greater number of devices needed for NCMOS will directly impact yield. Circuit speed may also be detrimentally impacted by NCMOS because of the greater number of devices required.

Certain embodiments comprise circuits formed in processes producing many thousands of transistor-based circuits on each wafer, and may be integrated into products such as (but not limited to) greetings cards, bottle labels, security ID cards or toys and games, for example. The incorporation of NCMOS into appropriate designs enhances the functionality achievable. In different applications, depending on the various levels of circuit complexity, a balance between the choice of NCMOS or NMOS should be considered; for a given design a hybrid of these technologies may, or may not, be appropriate.

Hybrid designs of NMOS and NCMOS may be appropriate in certain embodiments. This can be accommodated in design software and, indeed, combinations of CMOS and NMOS devices are already used in the design of conventional silicon chips. Certain embodiments are timers made with both NCMOS and NMOS logic and/or a hybrid of both.

Figure 5:
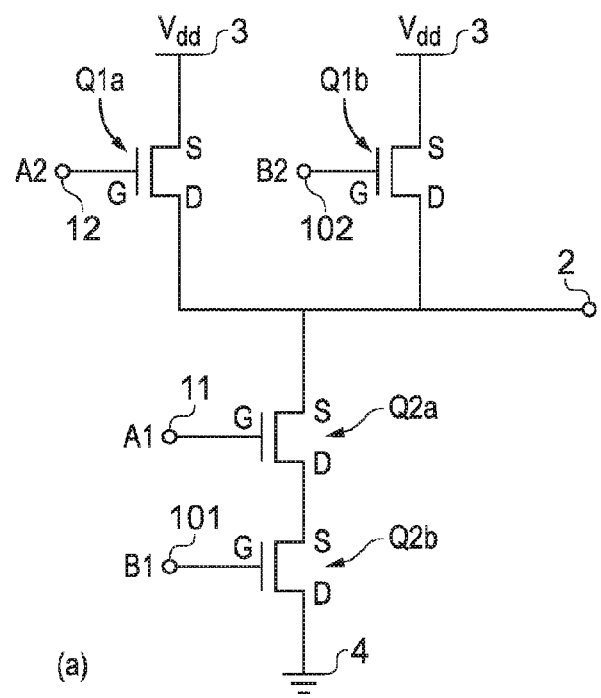
FIG. 5 illustrates a NAND circuit embodying the invention.
Figure 5:
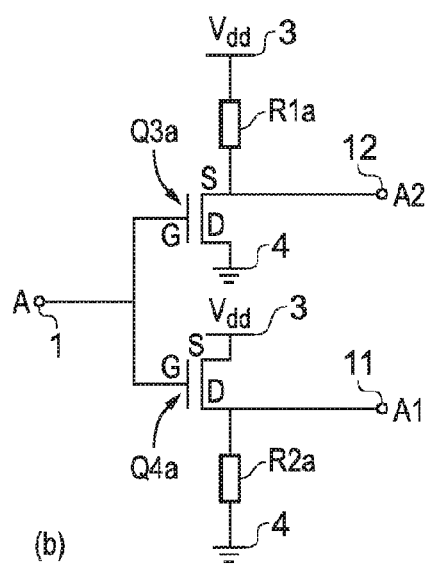
Figure 5:
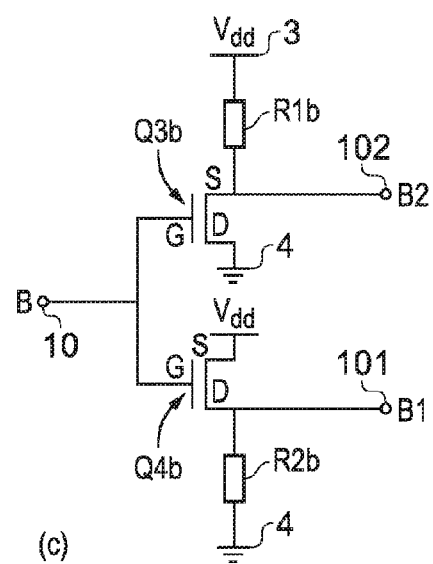

Referring now to FIG. 5, this illustrates a NAND circuit embodying the invention. In the language of claim 1, the first to fourth FETs are devices Q1a, Q2a, Q3a, and Q4a respectively, and the first and second loads are R1a and R2a. The input terminal 1 is a first input terminal A, and the gate comprises the configuration shown in FIG. 5b to provide gate drives to the first and second transistors via terminals 12 and 11 respectively (which are also labelled as A2 and A1 respectively in the figure). The circuit comprises a fifth FET of the same type and connected between the first supply rail 3 and the output terminal 2, in parallel with the first FET Q1A. The circuit further comprises a sixth FET Q2b of the same type and connected in series with the second FET Q2a between the output terminal 2 and the second rail 4. In other words, the source of the sixth FET is connected to the drain of the second FET, and the drain of the sixth FET is connected to ground in this example. Thus, it will be appreciated that in this example the drain of the second FET Q2a is connected to the second rail 4, but not directly. Instead, it is connected to that rail via the source-drain conductive channel of the sixth FET Q2b.

In this circuit, the gate drives to the fifth and sixth FETs Q1b, Q2b are provided by the circuit portion shown in FIG. 5c. This circuit portion generally has the same configuration as the circuit portion shown in FIG. 5b. It includes a second input terminal 10, B which provides a gate drive to a seventh FET Q3b and an eighth FET Q4b, each of which have the same type as all the other transistors shown in the figure. The circuit portion of FIG. 5c includes a third load R1b and a fourth load R2b. The connections between these various circuit components are the same as in the circuit of FIG. 5b and will be apparent from the figure. Thus, the circuit portion of FIG. 5c, supplied with the second input B, provides a drive to the gate of the fifth FET Q1b via terminal 102, B2, and a drive to the gate terminal of the sixth FET Q2b via terminal 101, B1.

Figure 6:
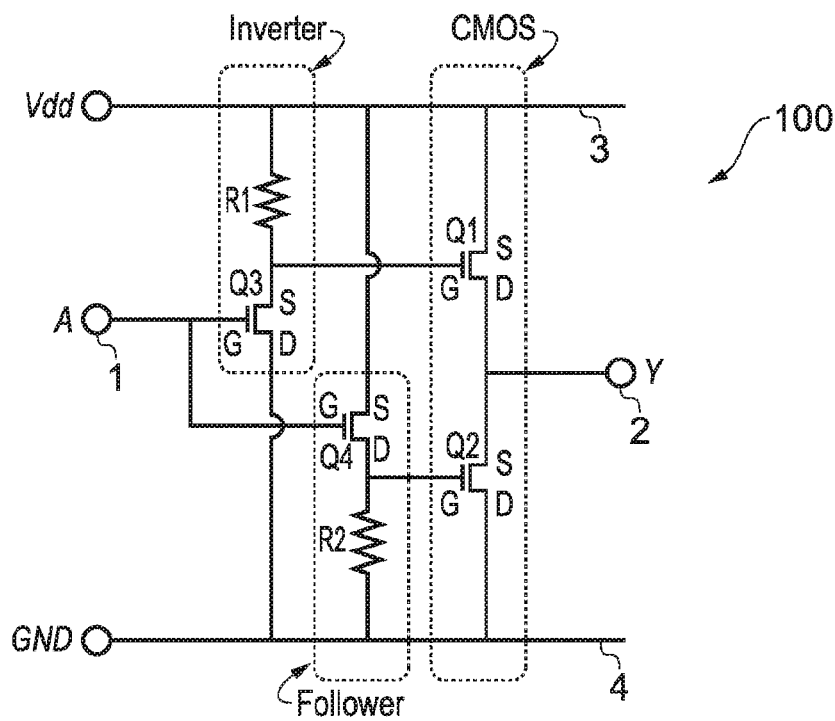
FIG. 6 illustrates an inverter circuit embodying the invention and comprising four transistors and two resistors.

Referring now to FIG. 6, this shows an inverter circuit embodying the invention and having the same general configuration as the circuit shown in FIG. 4. In this example, the input terminal 1 provides an inverter input (labelled A in the figure) and the output terminal 2 provides the inverter output (labelled Y). It will be appreciated that the combination of the third FET Q3 and first load R1 provide, or act as, an inverter or inverter stage, and the combination of the fourth FET Q4 and second load R2 provide a follower stage or module. The inverter is generally indicated by reference numeral 100.

Figure 7:
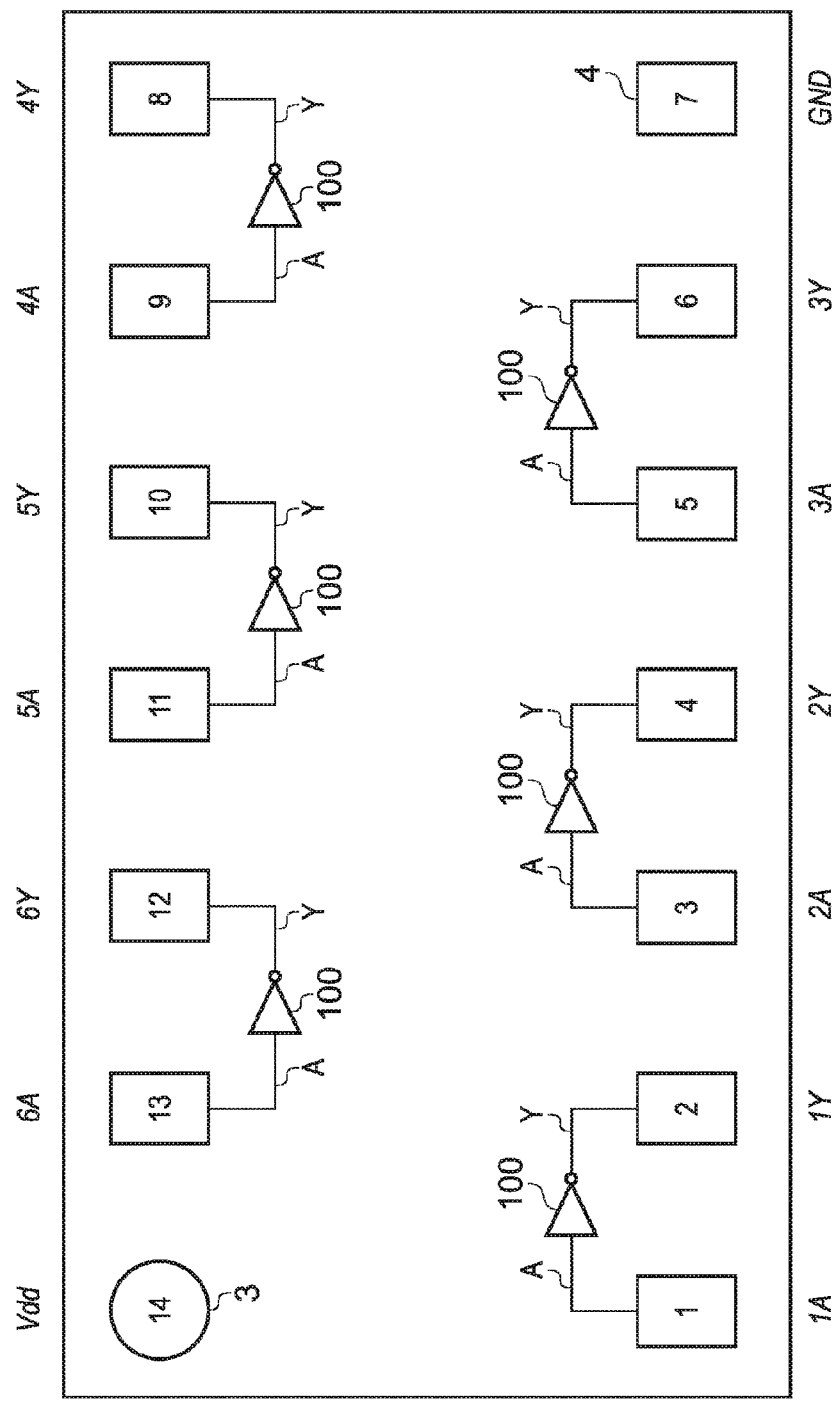
FIG. 7 illustrates a HEX inverter embodying the invention and comprising 24 transistors and 12 resistors.

Referring now to FIG. 7, this shows a HEX inverter circuit embodying the invention. In this embodiment, the HEX inverter circuit is provided in a dual in-line package (DIP) module, having 14 contacts, labelled 1 to 14 in the figure. In certain embodiments, these contacts may take the form of contact pins or contact pads, for example. The HEX inverter comprises six inverters 100, each inverter being as shown in FIG. 6. Each inverter 100 is connected between a respective pair of the contacts, with the first inverter 100 having its input A connected to contact 1 and its output Y connected to contact 2, etc. Contact 14 is connected to the first supply rail 3, and contact 7 is connected to the second supply rail 4. Although the illustrated embodiment is in the form of a DIP module, alternative embodiments may provide an inverter circuit, such as a HEX inverter circuit as illustrated, on a printed interconnect sheet.

Figure 8:
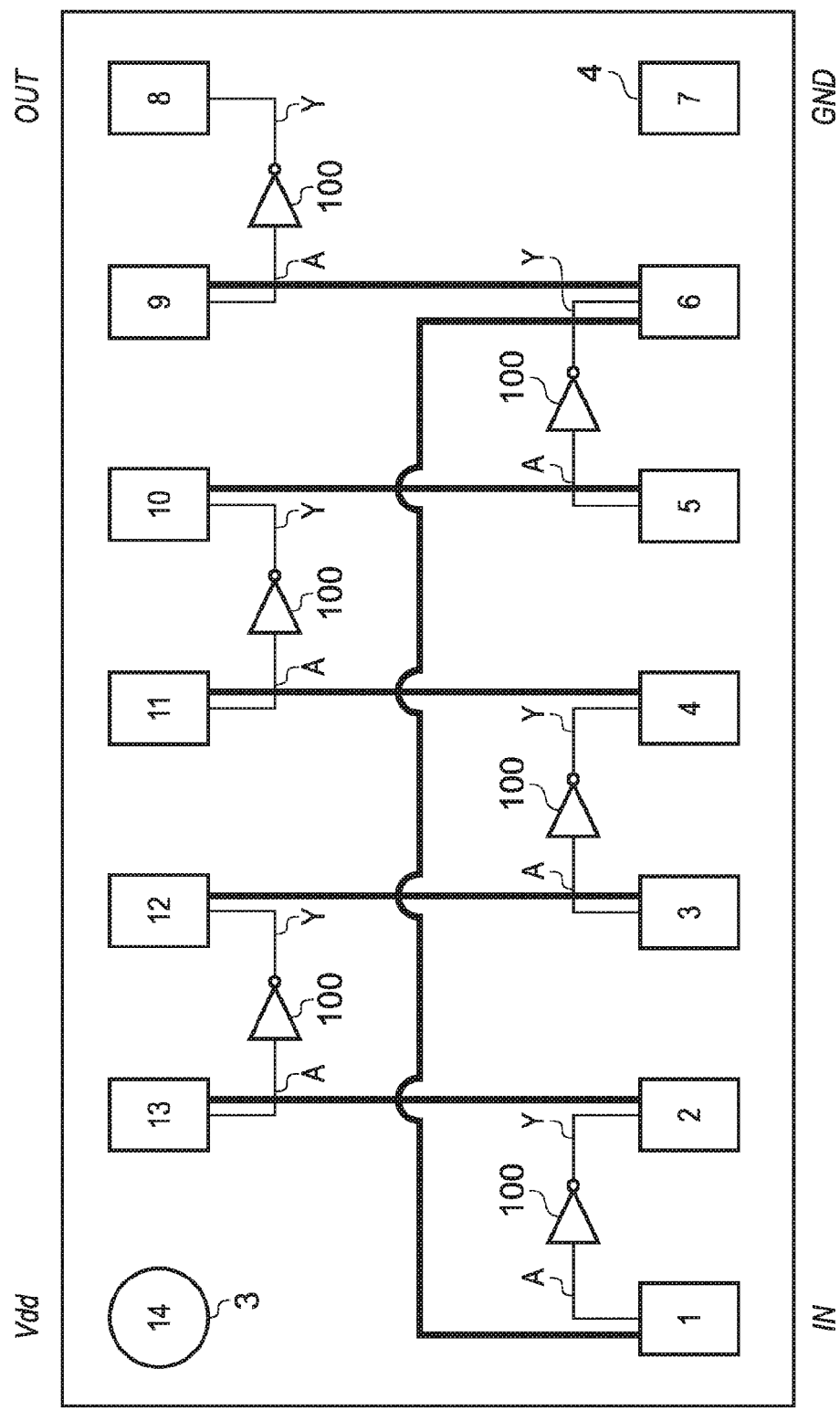
FIG. 8 illustrates a five-stage ring oscillator embodying the invention.

Referring now to FIG. 8, this illustrates a five-stage ring oscillator embodying the invention and based on the HEX inverter of FIG. 7. The circuit of FIG. 8 comprises the same arrangement of six inverters 100 connected to respective pairs of contacts, but also provides additional connections between the contacts as illustrated in the figure. Thus, contact 1 is connected to contact 6, contact 6 is connected to contact 9, etc.

Figure 9:
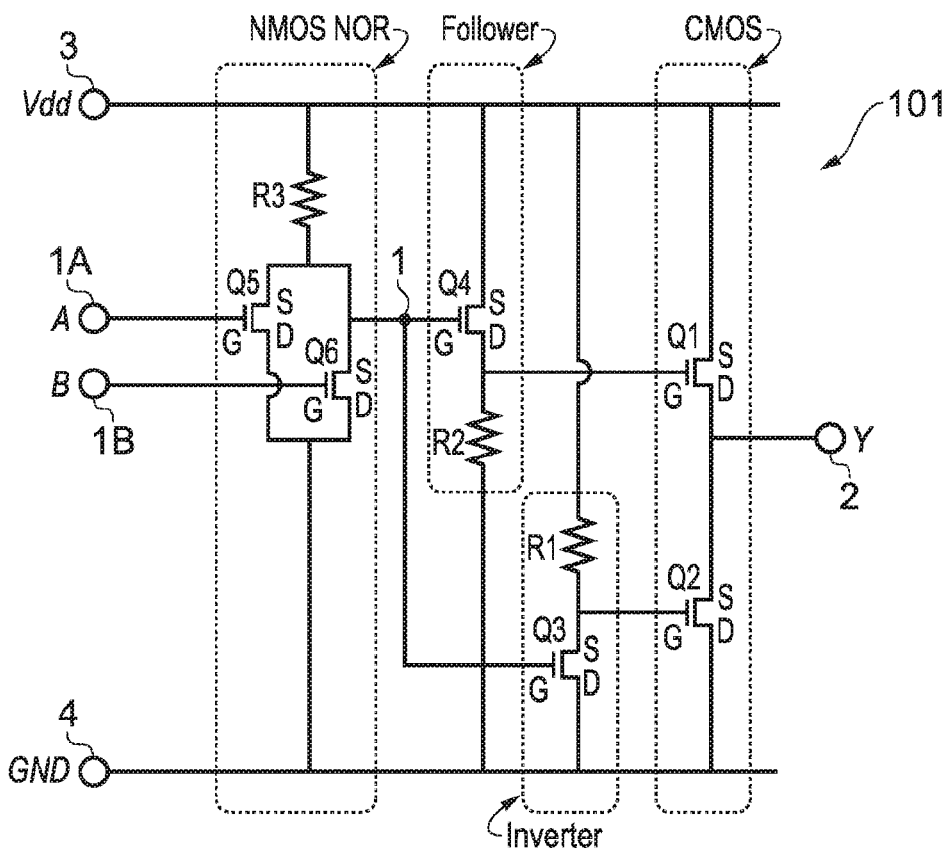
FIG. 9 illustrates a NOR circuit embodying the invention and comprising six transistors and three resistors.

Referring now to FIG. 9, this shows a NOR circuit embodying the invention and having the structure defined by claim 24, where the first to sixth FETs are labelled Q1-Q6 respectively, and the first to third loads are labelled R1-R3 respectively. The follower, inverter, and CMOS stages in the figure together provide a circuit in accordance with claim 22, having an input terminal labelled 1 and an output terminal 2, which provides the output Y of the NOR circuit. The circuit has a first NOR input A, and a second NOR input B. The first supply rail is labelled 3, and the second supply rail (which is ground in this example) is labelled 4. The fifth and sixth FETs together with third load R3 effectively provide an NMOS NOR stage, delivering a NOR output to input terminal 1 according to the input provided to A and B.

Figure 10:
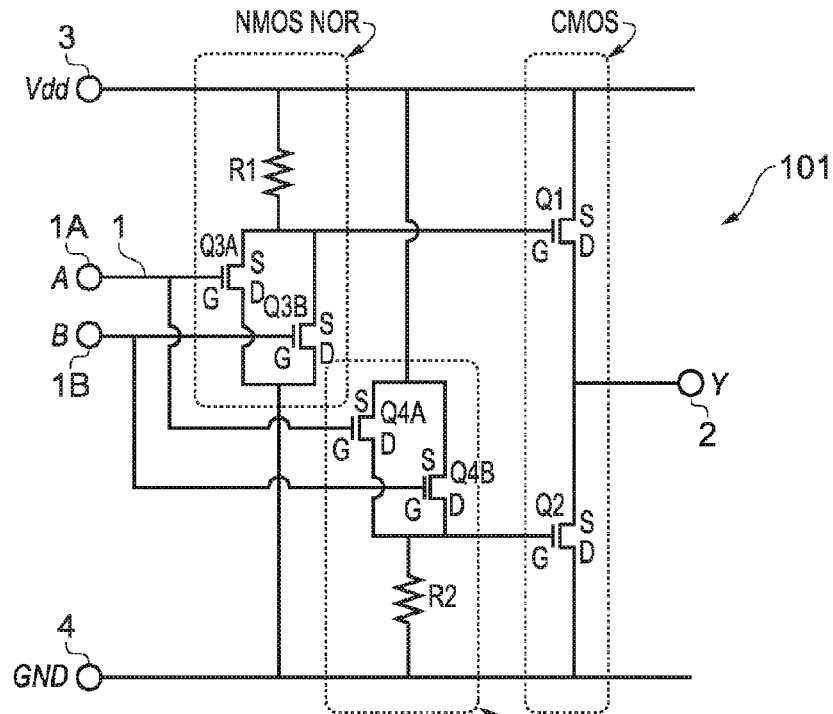
FIG. 10 illustrates another NOR gate embodying the invention and comprising six transistors and two resistors.

Referring now to FIG. 10, this shows another NOR circuit embodying the invention and having the structure defined by claim 13 as dependent upon claim 1. In this embodiment, rather than having just a single third FET, the circuit comprises a pair of "third" FETs, labelled Q3A and Q3B in the figure. In the language of claim 13, Q3A and Q3B are "a third pair of FETs". The first FET of that pair (ie Q3A) has its gate connected to the first NOR input A, and the second of the pair (Q3B) has its gate connected to the second NOR input B. Similarly, rather than a single fourth FET (as was the case in the inverter circuit of FIG. 4 or FIG. 6) this circuit comprises a pair of "fourth" FETs, referred to as "a fourth pair of FETs" in the language of claim 13. The connections between the various components in FIG. 10 are as defined by claim 13.

Figure 11:
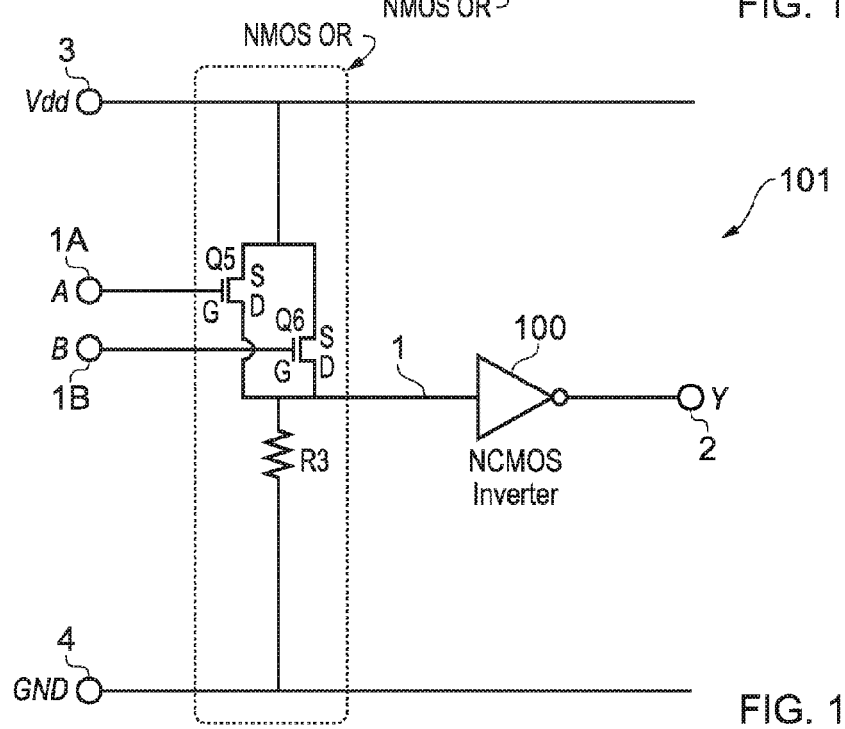
FIG. 11 illustrates another NOR circuit embodying the invention and comprising six transistors and three resistors.

Referring now to FIG. 11, this shows another NOR circuit embodying the invention. This circuit incorporates an inverter 100 as illustrated in FIG. 6, with the output terminal 2 providing the output Y of the NOR circuit. The circuit arrangement is as defined by claim 14. Thus, the input terminal 1 is driven by the output of an OR stage which comprises fifth and sixth FETs and a third load R3. The gates of the fifth and sixth FETs are connected respectively to the first and second NOR inputs A, B, the sources of the fifth and sixth transistors are connected to the high supply rail three, and the drains of the fifth and sixth FETs are connected via resistor R3 to ground. Thus, the channels of the fifth and sixth transistors are arranged in parallel between the upper supply rail and load resistor R3.

Figure 12:
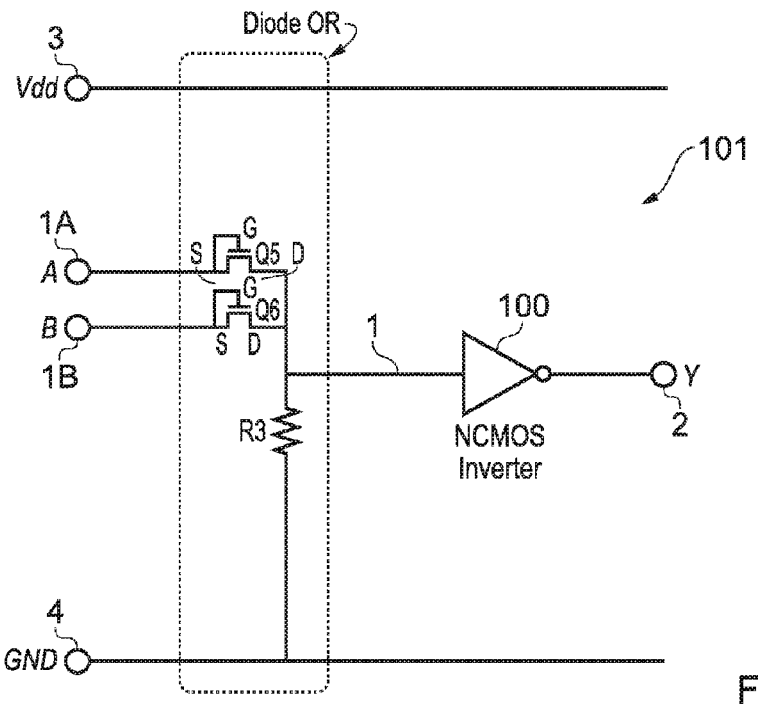
FIG. 12 illustrates another NOR circuit embodying the invention and comprising six transistors and three resistors.

Referring now to FIG. 12, this shows another NOR circuit embodying the invention, and again incorporating an inverter circuit 100 as illustrated in FIG. 6, The overall arrangement of the circuit is as defined by claim 15. In this arrangement, the drains of the fifth and sixth FETs are connected together and to the input terminal 1 of the inverter circuit 100 that input terminal 1 is connected via load R3 to ground. The first NOR input A is connected to the gate and source of the fifth FET, and the second NOR input B is connected to the gate and source of the sixth transistor.

Figure 13:
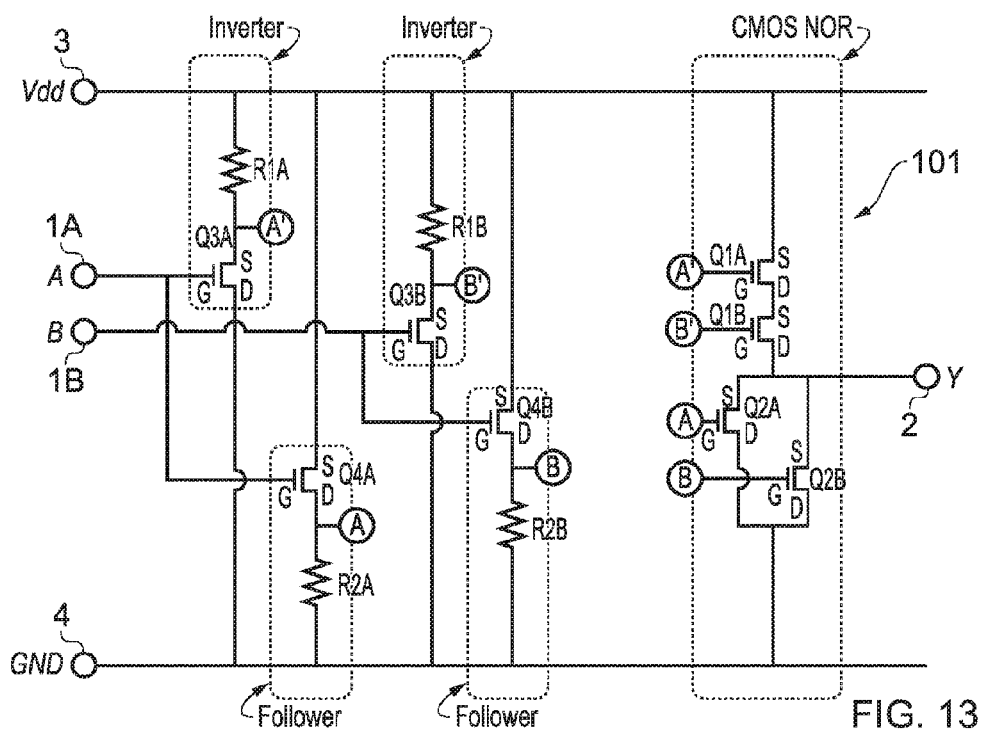
FIG. 13 illustrates another NOR circuit embodying the invention and comprising eight transistors and four resistors'

Referring now to FIG. 13, this shows another NOR circuit embodying the invention. The arrangement of the circuit elements is as defined by claim 16, with the first FET being Q1A, the first pair of FETs being Q1A and Q1B, the second FET being Q2A, the second pair of FETs being Q2A and Q2B, the third FET being Q3A, the third pair of FETs being Q3A and Q3B, the fourth transistor being Q4A, the fourth pair of FETs being Q4A and Q4B, the first load being R1A, the first pair of loads being R1A and R1B, the second load being R2A, and the second pair of load being R2A and R2B. As can be seen, the gate of Q1A is connected to the source of Q3A, the gate of Q1B is connected to the source of Q3B, the gate of Q2A is connected to the drain of Q4A, and the gate of Q2B is connected to the drain of Q4B. Q3A and R1A together provide an inverter stage, as do the combination of Q3B and R1B. The combination of Q4A and R2A provides a follower module, as does the combination of Q4B and R2B. The first and second pairs of FETs provide a NOR stage.

Figure 14:
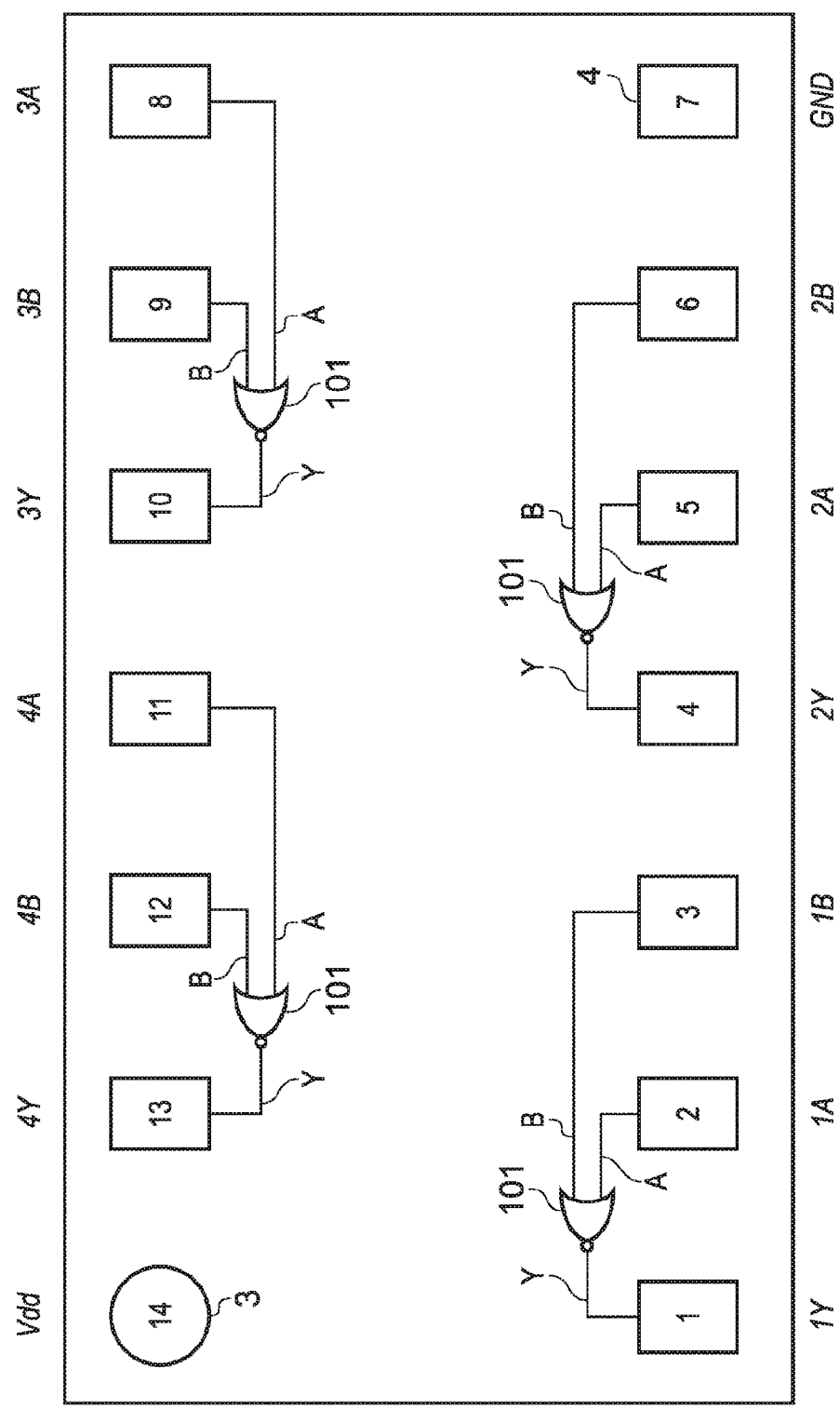
FIG. 14 illustrates a quad NOR circuit embodying the invention and comprising 24 transistors and 12 resistors.

Referring now to FIG. 14, this shows a quad NOR circuit embodying the invention, and incorporating four NOR circuits in accordance with any other aspect or embodiment of the invention. The connections between the inputs and outputs of the NOR circuits to the 14 contacts are as shown in the figure. Thus, the first NOR circuit 101 has its output Y connected to contact 1, its first input A connected to contact 2, and its second input B connected to contact 3, etc.

Figure 15:
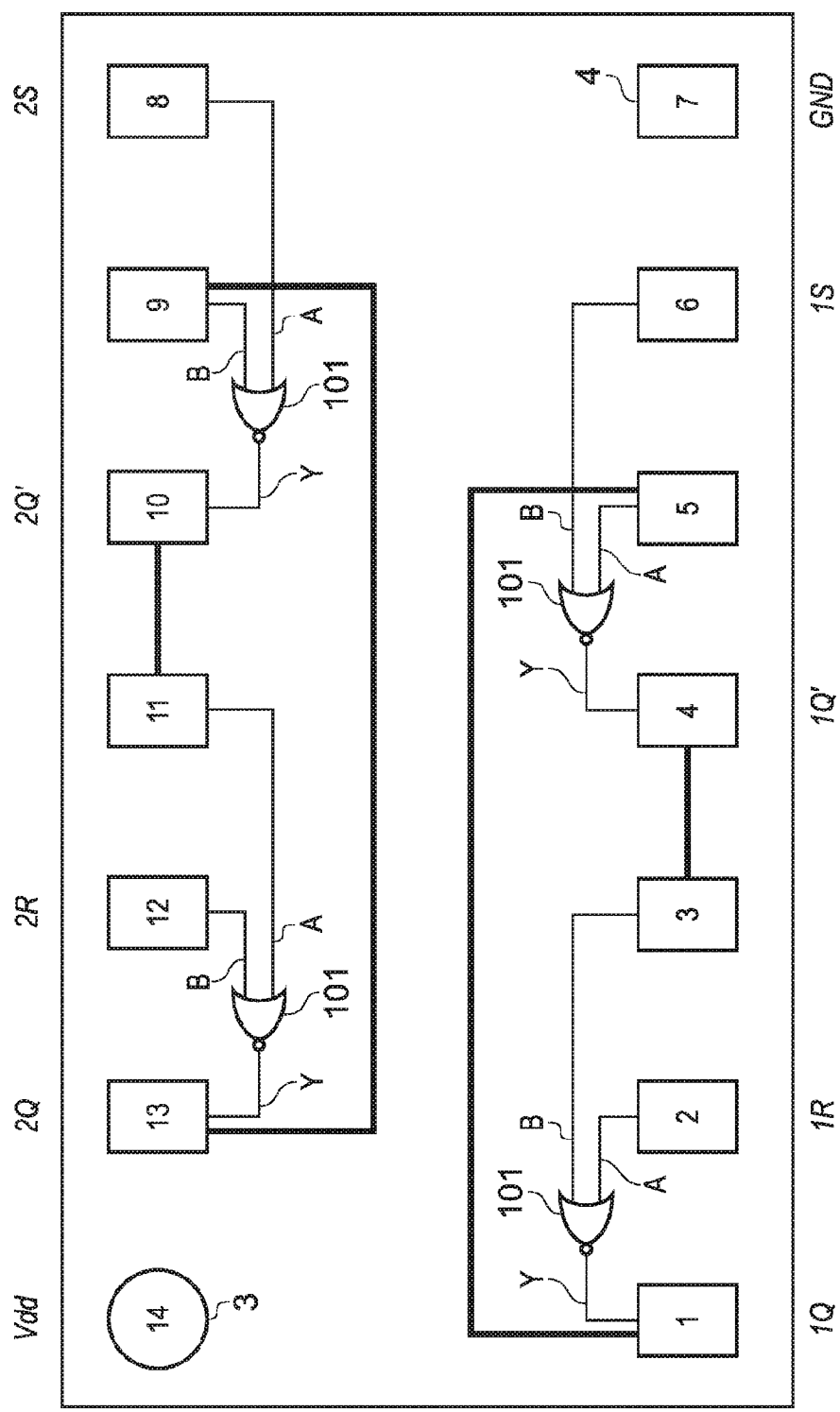
FIG. 15 illustrates a dual SR latch circuit embodying the invention.

Referring now to FIG. 15, this shows a dual SR latch circuit embodying the invention and based on the quad NOR circuit of FIG. 14. FIG. 15 shows the additional connections between the contacts to provide the dual SR latch function. Thus, contact 1 is connected to contact 5, contact 3 is connected to contact 4, etc., as shown in the figure.

Figure 16:
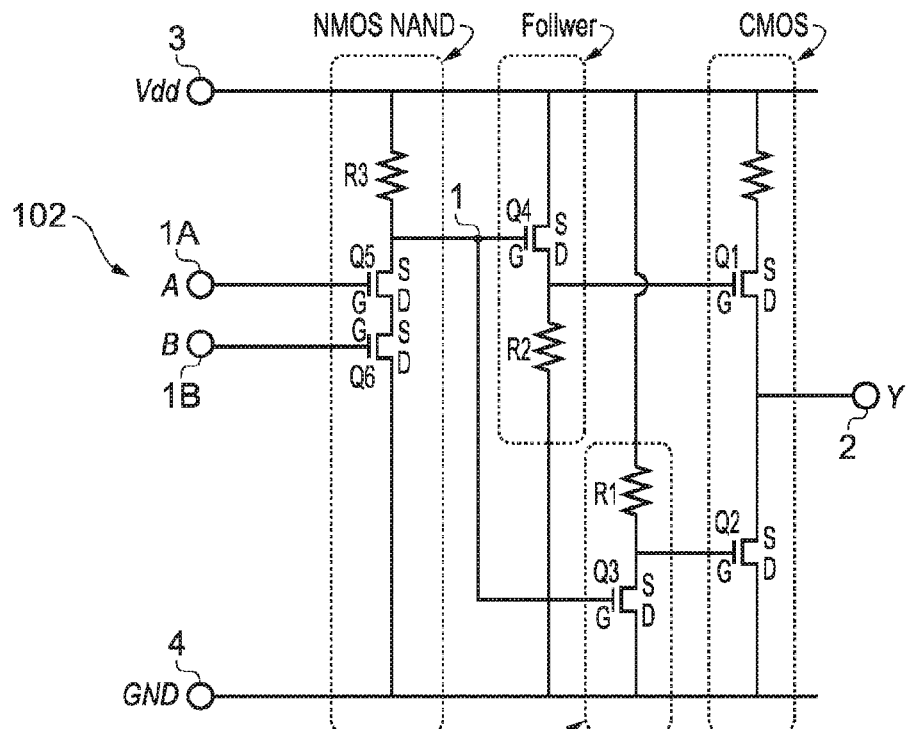
FIG. 16 illustrates a NAND circuit embodying the invention and comprising six transistors and three resistors.

Referring now to FIG. 16, this shows a NAND circuit 102 embodying the invention. The arrangement of the various circuit components is as defined by claim 23, where the first to sixth FETs are labelled Q1-Q6 respectively, and the first to third loads are labelled R1-R3 respectively. The fifth and sixth transistors have their channels connected in series, between third load (resistor R3) and ground. The fifth and sixth FETs and resistor R3 provide a NAND stage, which delivers a NAND input to input terminal 1 according to the signals provided to NAND inputs A and B.

Figure 17:
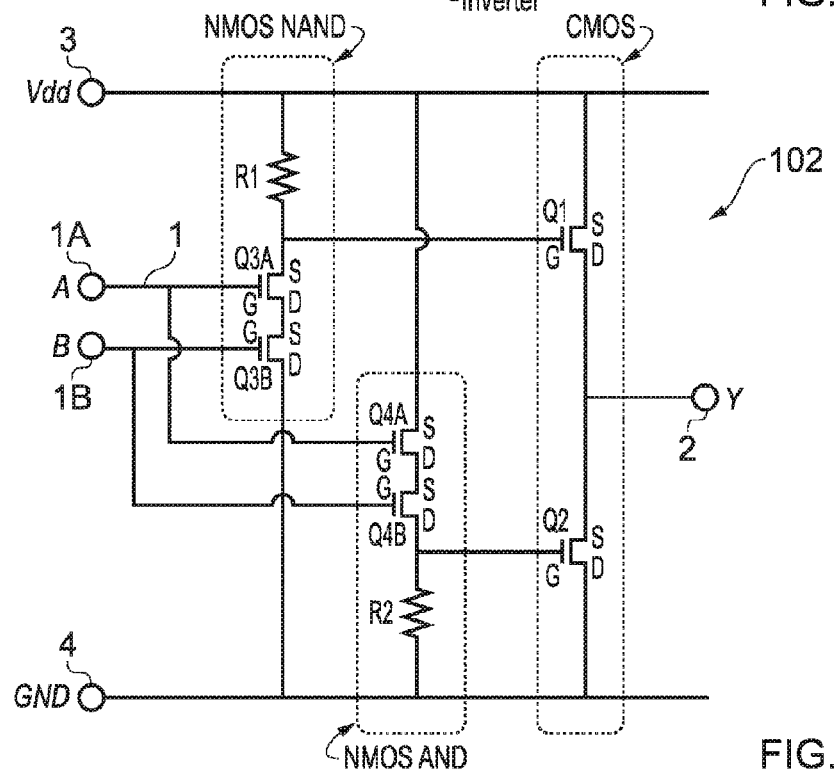
FIG. 17 illustrates another NAND circuit embodying the invention and comprising six transistors and two resistors.

Referring now to FIG. 17, this shows another NAND circuit embodying the invention, with the arrangement of the circuit components being as defined by claim 19 as dependent on claim 1. This NAND circuit 102 comprises a pair of third FETs (Q3A and Q3B), with their channels arranged in series between first load R1 and ground. The circuit also comprises a pair of fourth FETs Q4A and Q4B, arranged with their channels connected in series between the upper supply rail and second load R2.

Figure 18:
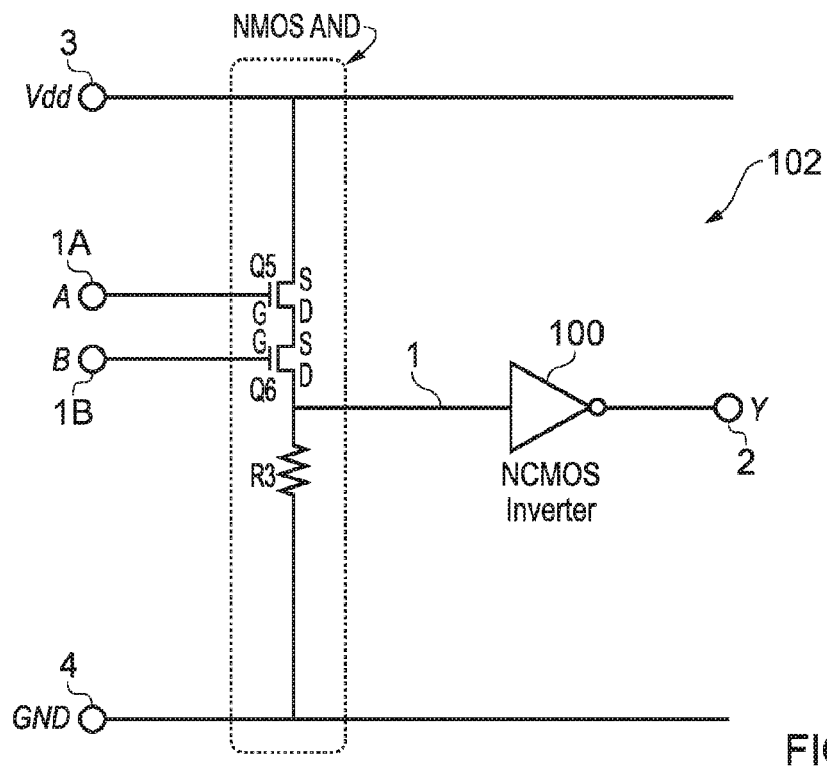
FIG. 18 illustrates another NAND circuit embodying the invention and comprising six transistors and three resistors.

Referring now to FIG. 18, this shows another NAND circuit embodying the invention, and comprising an inverter 100 as illustrated in FIG. 6. This circuit includes an AND stage comprising fifth and sixth FETs Q5 and Q6, connected in series with third load resistor R3 between the supply rails 3, 4. The voltage at the drain of the sixth FET is supplied to the input terminal 1 of the inverter. The overall arrangement is as defined by claim 20.

Figure 19:
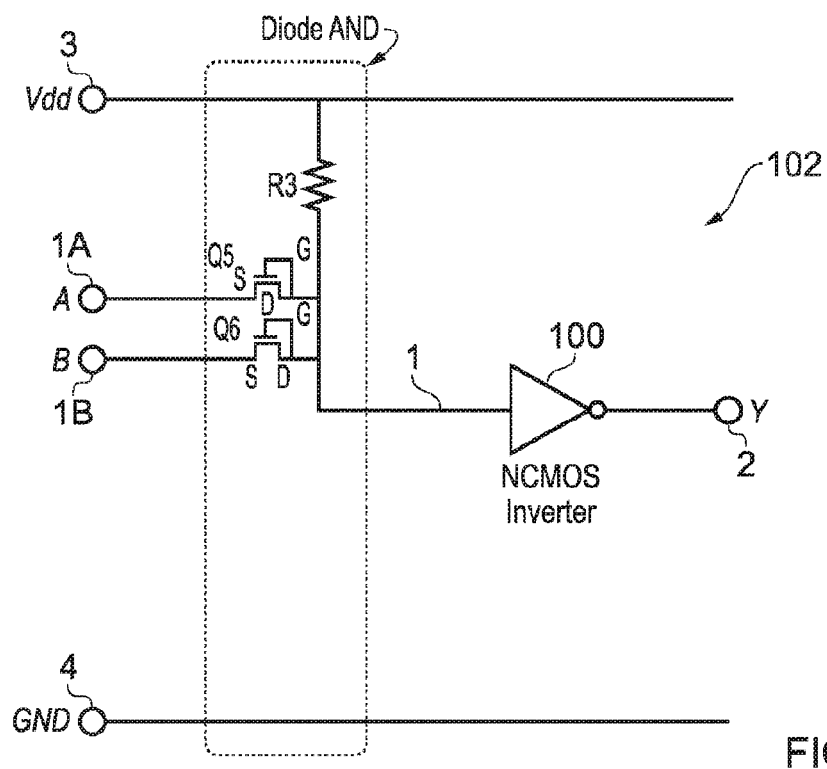
FIG. 19 illustrates another NAND circuit embodying the invention and comprising six transistors and three resistors.

Referring now to FIG. 19, this shows another NAND circuit embodying the invention, and having the structure as defined by claim 21 as dependent upon claim 1. Here, the fifth and sixth transistors have their source terminals respectively connected to the first and second inputs A, B, the gate of each of the fifth and sixth FETs is tied to its respective drain, and the drain terminals are connected to the input terminal 1 of the inverter stage 100. Load resistor R3 is connected between supply rail 3 and the input terminal 1.

Figure 20:
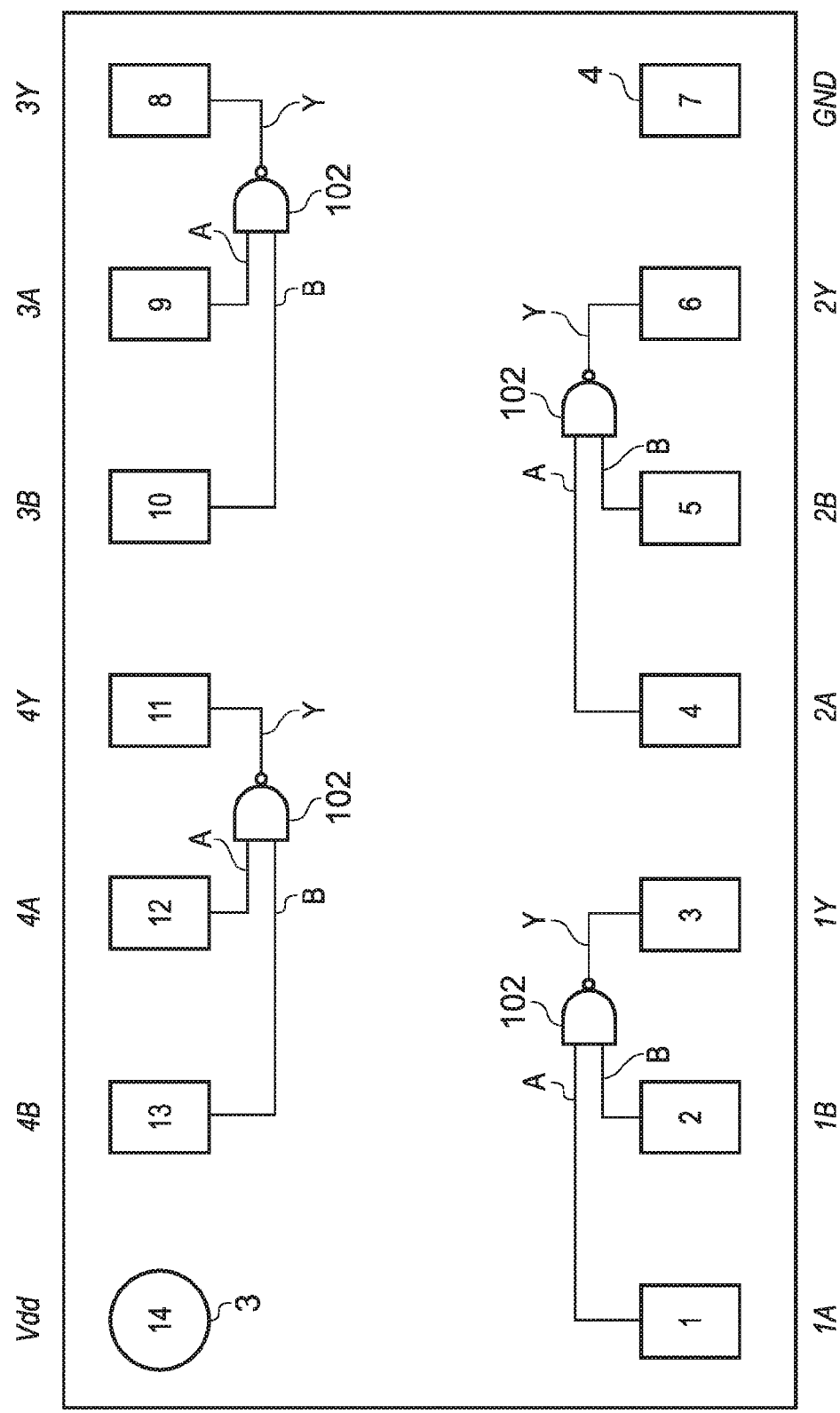
FIG. 20 illustrates a quad NAND circuit embodying the invention and comprising 24 transistors and 12 resistors.

Referring now to FIG. 20, this illustrates a quad NAND circuit embodying the invention, and comprising four NAND circuits in accordance with any other aspect or embodiment of the invention. The connections of the respective NAND circuit inputs and outputs to the 14 contacts are as shown in the figure.

Figure 21:
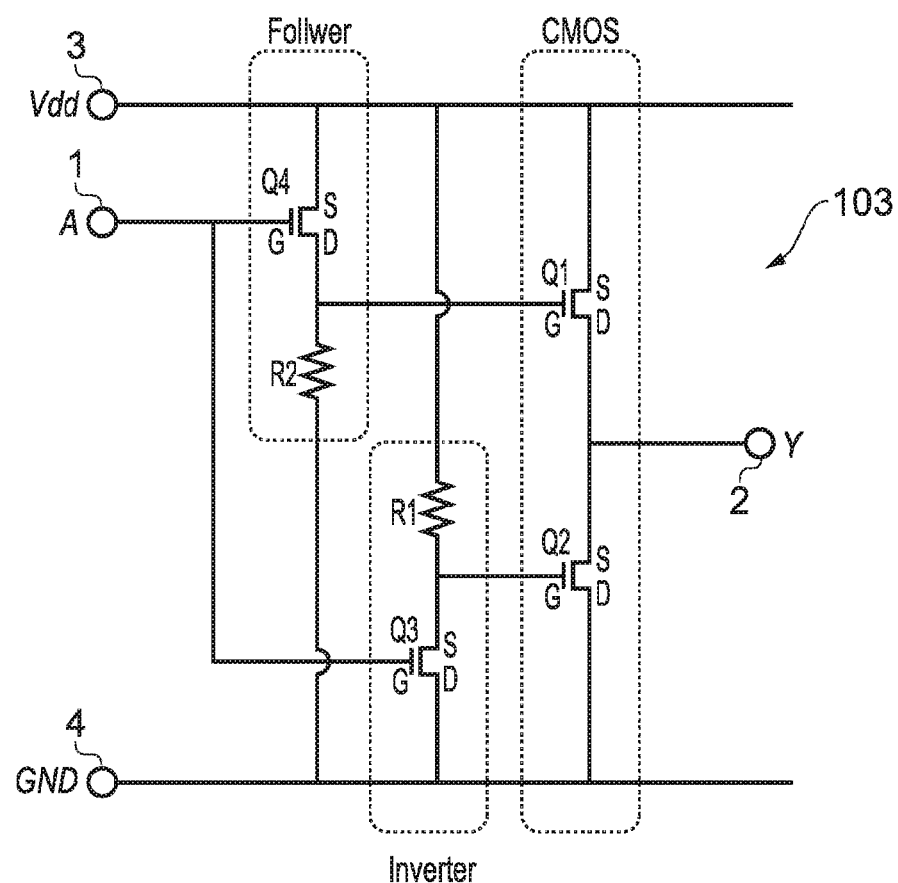
FIG. 21 illustrates a buffer circuit embodying the invention and comprising four transistors and two resistors.

Referring now to FIG. 21, this shows a buffer embodying the invention, and having the structure as defined by claim 26.

Figure 22:
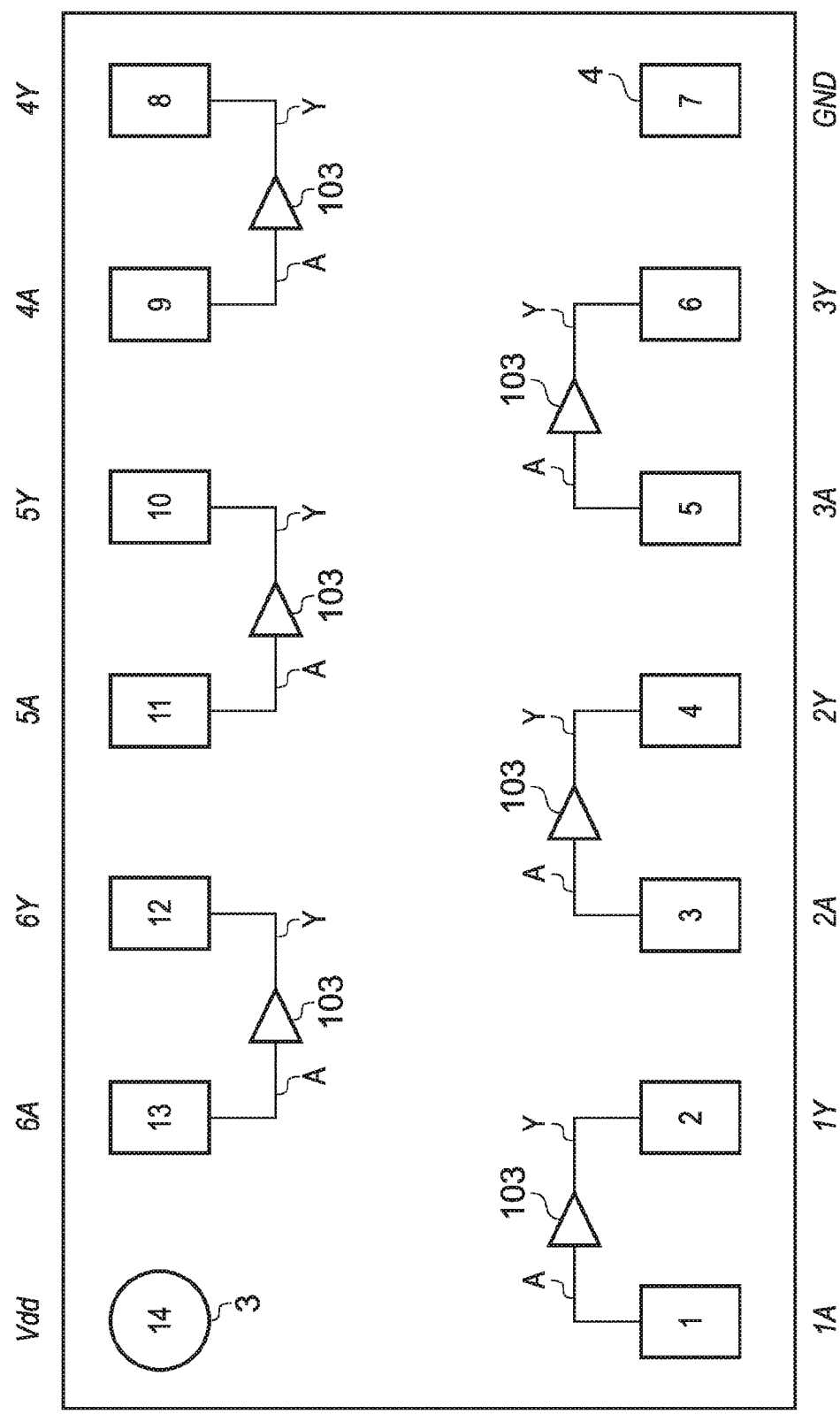
FIG. 22 illustrates a HEX buffer circuit embodying the invention and comprising 24 transistors and 12 resistors.

FIG. 22 illustrates a HEX buffer circuit embodying the invention and comprising six buffer circuits 103 as shown in FIG. 21. Again, the connections of the buffer inputs and outputs to the contacts are as illustrated in the figure.

Figure 23:
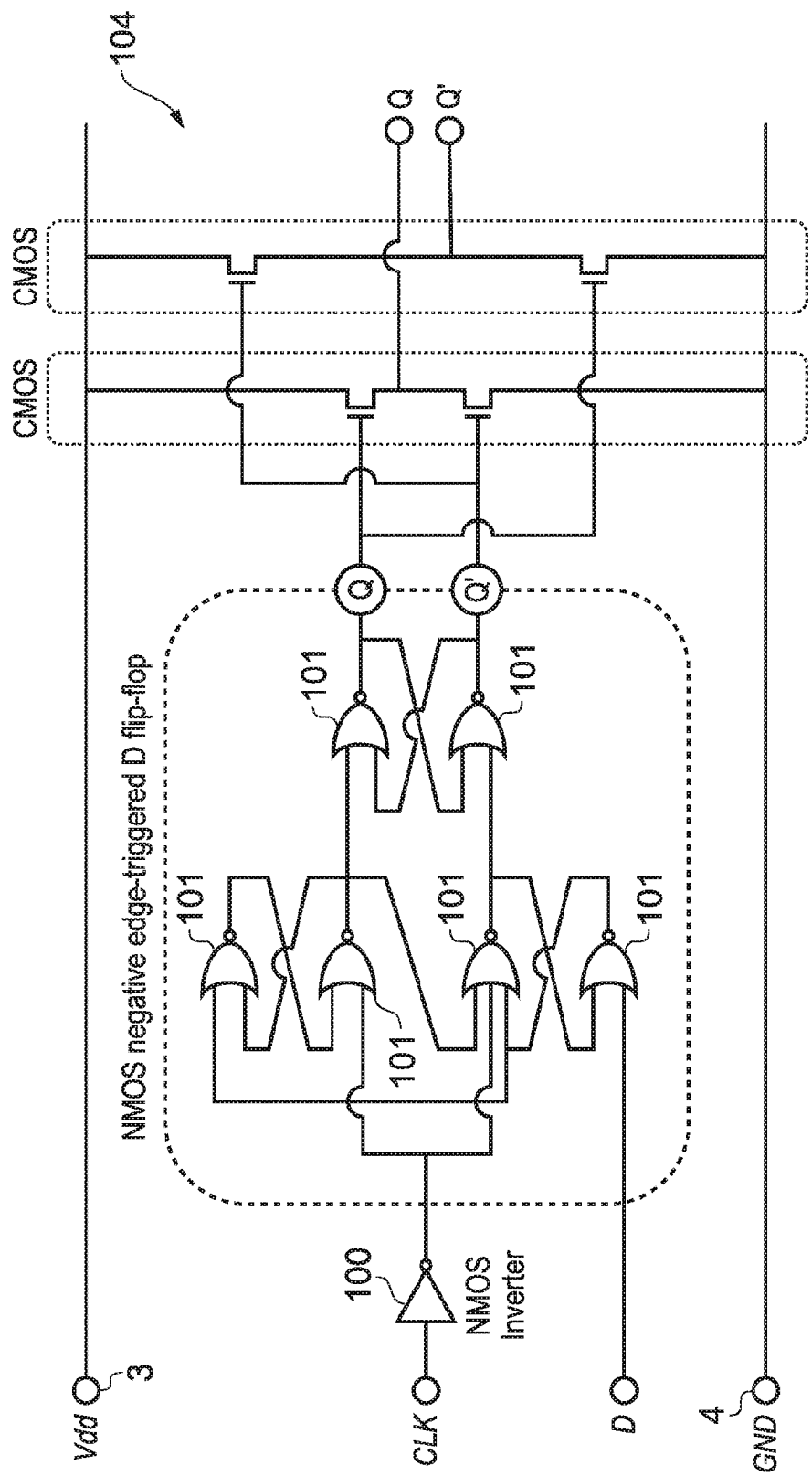
FIG. 23 illustrates a D-type flip-flop circuit embodying the invention and comprising 17 transistors and 7 resistors.

Referring now to FIG. 23, this illustrates a D-type flip-flop circuit embodying the invention having a first supply rail 3, a second supply rail 4, a clock input (CLK), a "ID" input, and providing two outputs Q and Q prime. This particular flip-flop circuit comprises one inverter 100 embodying the invention, and six NAND circuits embodying the invention, connected as shown in the figure. The flip-flop circuit also comprises two CMOS output stages, each of which comprises a respective pair of FETs, having their channels connected in series between the two supply rails, and a node between the respective pair of FETs being connected to the respective output terminal (Q or Q prime).

Figure 24:
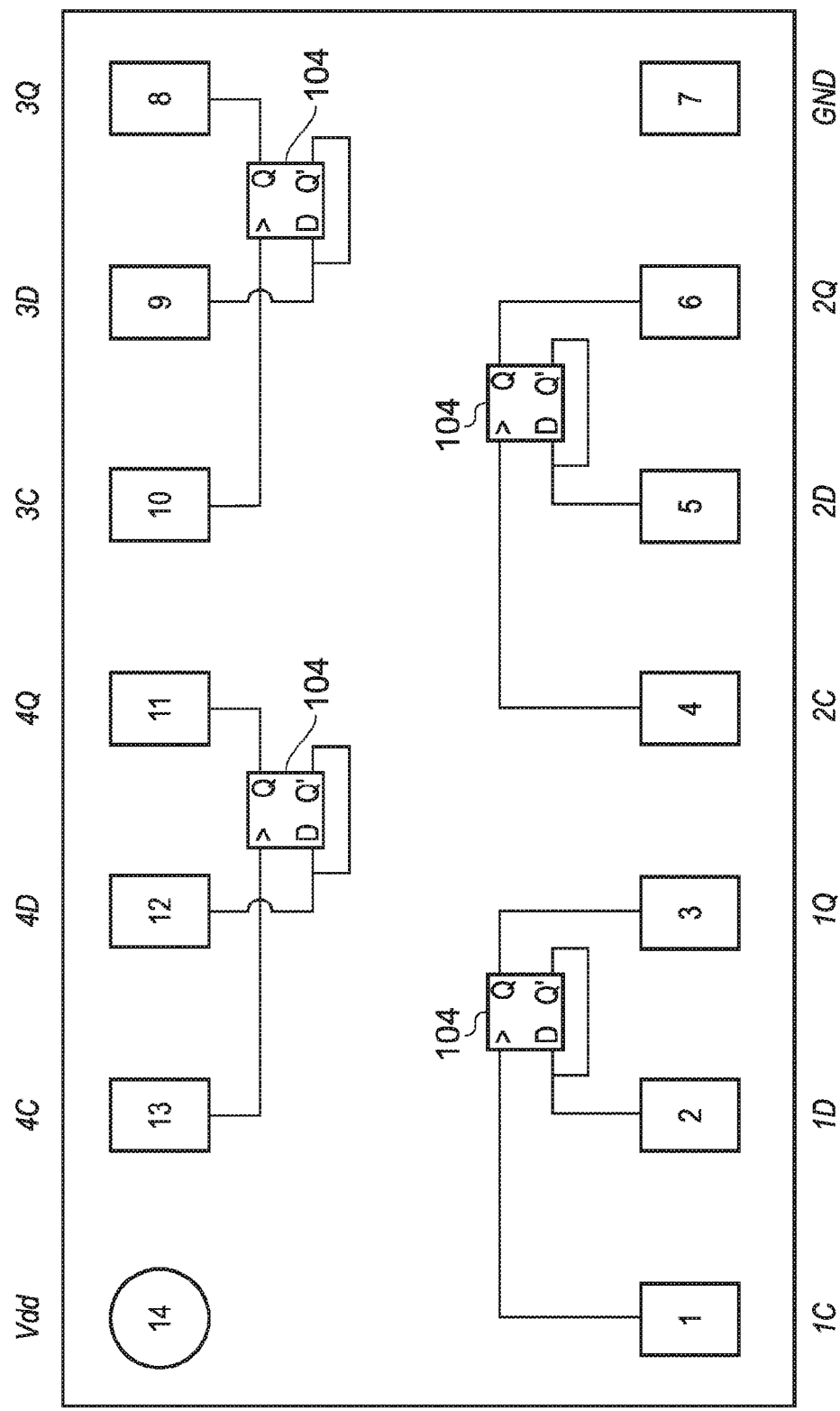
FIG. 24 illustrates a Quad clock divider circuit embodying the invention and comprising 68 transistors and 28 resistors.

Referring now to FIG. 24, this shows a quad clock divider circuit embodying the invention, and comprising four flip-flop circuits as shown in FIG. 23. The connections of the respective flip-flop input and outputs to the contact pins are as shown in the figure.

It will be appreciated that, whilst the above-described embodiments have incorporated NMOS devices, in further alternative embodiments, the FETs employed may be PMOS devices. Thus, in certain embodiments, all of the FETs incorporated in the circuit may be NMOS devices, and in certain alternative embodiments all of the FETs incorporated in the circuit may be PMOS devices. In other words, in certain embodiments the first type is NMOS, and in certain alternative embodiments the first type is PMOS.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An electronic circuit comprising:
   an input terminal;
   an output terminal;
   a first supply rail;
   a second supply rail;
   a first field effect transistor, FET, of a first type and having respective gate, source and drain terminals;
   a second FET of said first type and having respective gate, source and drain terminals;
   a third FET of said first type and having respective gate, source and drain terminals;
   a fourth FET of said first type and having respective gate, source and drain terminals;
   a first load; and
   a second load,
   wherein
   the source of the first FET is connected to the first supply rail,
   the drain of the first FET and the source of the second FET are connected to the output terminal,
   the drain of the second FET is connected to the second supply rail,
   the gate of the third FET and the gate of the fourth FET are connected to the input terminal,
   the drain of the third FET is connected to the second supply rail,
   the first load is connected between the first supply rail and the source of the third FET,
   the second load is connected between the drain of the fourth FET and the second supply rail,
   the gate of the first FET is connected to a node between the source of the third FET and the first load such that a voltage at the source of the third FET is applied to the gate of the first FET, and
   the gate of the second FET is connected to a node between the drain of the fourth FET and the second load such that a voltage at the drain of the fourth FET is applied to the gate of the second FET.

2. An electronic circuit comprising:
   an input terminal;
   an output terminal;
   a first supply rail;
   a second supply rail;
   a first field effect transistor, FET, of a first type and having respective gate, second and third terminals;
   a second FET of said first type and having respective gate, second and third terminals;
   a third FET of said first type and having respective gate, second and third terminals;
   a fourth FET of said first type and having respective gate, second and third terminals;
   a first load; and
   a second load,
   wherein the second terminal of the first FET is connected to the first supply rail, the third terminal of the first FET and the second terminal of the second FET are connected to the output terminal, the third terminal of the second FET is connected to the second supply rail, the gate of the third FET and the gate of the fourth FET are connected to the input terminal, the third terminal of the third FET is connected to the second supply rail, the first load is connected between the first supply rail and the second terminal of the third FET, the second load is connected between the third terminal of the fourth FET and the second supply rail, the gate of the first FET is connected to a node between the second terminal of the third FET and the first load such that a voltage at the second terminal of the third FET is applied to the gate of the first FET, and the gate of the second FET is connected to a node between the third terminal of the fourth FET and the second load such that a voltage at the third terminal of the fourth FET is applied to the gate of the second FET.

3. A circuit in accordance with claim 2, wherein said first type is one of enhancement mode and depletion mode.

4. A circuit in accordance with claim 2, wherein said first type is NMOS.

5. A circuit in accordance with claim 2, wherein the circuit is a logic circuit.

6. A circuit in accordance with claim 5, wherein the logic circuit is one of: an inverter; a NOT gate; a NAND gate; and a NOR gate.

7. A circuit in accordance with claim 2, wherein the circuit is an inverter, and the third terminal of the second FET is connected directly to the second supply rail.

8. A circuit in accordance with claim 2, wherein the circuit is a NAND circuit and the third terminal of the second FET is connected to the second rail via the channel of a further FET (Q2b) of said first type.

9. A circuit in accordance with claim 8, wherein the NAND circuit further comprises: a second input terminal (B); fifth (Q1b), sixth (Q2b), seventh (Q3b), and eighth (Q4b) FETs each of said first type and each having respective gate, second and third terminals; and third (Rib) and fourth (R2b) loads.

10. An inverter circuit comprising a circuit in accordance with claim 2, wherein said input terminal is arranged as an input of the inverter circuit and said output terminal is arranged as an output of the inverter circuit.

11. A HEX inverter circuit comprising six inverter circuits, each in accordance with claim 10.

12. A circuit module comprising fourteen contacts and a HEX inverter circuit in accordance with claim 11, wherein each inverter circuit is connected between a respective pair of said contacts, one of said contacts is connected to the first supply rail, and another of said contacts is connected to the second supply rail.

13. A ring oscillator circuit comprising six inverter circuits, each in accordance with claim 10.

14. A NOR circuit comprising a circuit in accordance with claim 2, the NOR circuit further comprising a first NOR input, A, and a second NOR input, B, wherein said output terminal is arranged as an output of the NOR circuit, said input terminal is arranged as said first NOR input, A, said third FET being one of a third pair of FETs, the second FET of said third pair of FETs having a gate connected to the second NOR input, B, a second terminal connected to the second terminal of said third FET, and a third terminal connected to said second supply rail, the fourth FET being one of a fourth pair of FETs, the second FET of said fourth pair of FETs having a gate connected to B, a second terminal connected to the first supply rail, and a third terminal connected to the gate of said second FET.

15. A NOR circuit comprising a circuit in accordance with claim 2, the NOR circuit further comprising a first NOR input, A, a second NOR input, B, fifth and sixth FETs of said first type, and a third load, wherein said output terminal is arranged as an output of the NOR circuit, A is connected to a gate of the fifth FET, B is connected to a gate of the sixth FET, the second terminals of the fifth and sixth FETs are each connected to the first supply rail, the third terminals of the fifth and sixth FETs are each connected to said input terminal, and the third load is connected between said input terminal and the second supply rail.

16. A NOR circuit comprising a circuit in accordance with claim 2, the NOR circuit further comprising a first NOR input, A, a second NOR input, B, fifth and sixth FETs of said first type, and a third load, wherein said output terminal is arranged as an output of the NOR circuit, A is connected to a gate and a second terminal of the fifth FET, B is connected to a gate and a second terminal of the sixth FET, the third terminals of the fifth and sixth FETs are each connected to said input terminal, and the third load is connected between said input terminal and the second supply rail.

17. A NOR circuit comprising a circuit in accordance with claim 2, the NOR circuit further comprising a first NOR input, A, and a second NOR input, B, wherein said output terminal is arranged as an output of the NOR circuit, said input terminal is arranged as said first NOR input, A, said first FET is one of a first pair of FETs, the second FET of said first pair having a second terminal connected to the third terminal of the first FET and a third terminal connected to said output terminal, said second FET being one of a second pair of FETs, the second FET of said second pair of FETs having a second terminal connected to said output terminal and a third terminal connected to said second supply rail, the third FET being one of a third pair of FETs, the second FET of said third pair of FETs having a gate connected to the second NOR input, B, and a third terminal connected to said second supply rail, the fourth FET being one of a fourth pair of FETs, the second FET of said fourth pair of FETs having a gate connected to B, and a second terminal connected to the first supply rail, the first load is one of a first pair of loads, the second load of said first pair of loads being connected between the first supply rail and the second terminal of the second FET of said third pair of FETs, and the second load being one of a second pair of loads, the second load of said second pair of loads being connected between a third terminal of the second FET of said fourth pair of FETs and the second supply terminal, and wherein the gate of the second FET of said first pair of FETs is connected to the second terminal of the second FET of said third pair of FETs, and the gate of the second FET of said second pair of FETs is connected to the third terminal of the second FET of the fourth pair of FETs.

18. A quad NOR circuit comprising four NOR circuits, each in accordance with claim 14.

19. A dual SR latch circuit comprising four NOR circuits, each in accordance with claim 14.

20. A NAND circuit comprising a circuit in accordance with claim 2, the NAND circuit further comprising a first NAND input, A, and a second NAND input, B, wherein said output terminal is arranged as an output of the NAND circuit, said input terminal is arranged as said first NAND input, A, said third FET being one of a third pair of FETs, the second FET of said third pair of FETs having a gate connected to the second NOR input, B, a second terminal connected to the third terminal of said third FET, and a third terminal connected to said second supply rail, the fourth FET being one of a fourth pair of FETs, the second FET of said fourth pair of FETs having a gate connected to B, a second terminal connected to the third terminal of said fourth FET, and a third terminal connected to the gate of said second FET.

21. A NAND circuit comprising a circuit in accordance with claim 2, the NAND circuit further comprising a first NAND input, A, a second NAND input, B, fifth and sixth FETs of said first type, and a third load, wherein said output terminal is arranged as an output of the NAND circuit, A is connected to a gate of the fifth FET, B is connected to a gate of the sixth FET, the second terminal of the fifth FET is connected to the first supply rail, the third terminal of the fifth FET is connected to the second terminal of the sixth FET, the third terminal of the sixth FET is connected to said input terminal, and the third load is connected between said input terminal and the second supply rail.

22. A NAND circuit comprising a circuit in accordance with claim 2, the NAND circuit further comprising a first NAND input, A, a second NAND input, B, fifth and sixth FETs of said first type, and a third load, wherein said output terminal is arranged as an output of the NAND circuit, A is connected to a second terminal of the fifth FET, B is connected to a second terminal of the sixth FET, the gates and third terminals of each of the fifth and sixth FETs are connected to said input terminal, and the third load is connected between said input terminal and the first supply rail.

23. An electronic circuit comprising:
an input terminal;
an output terminal;
a first supply rail;
a second supply rail;
a first field effect transistor, FET, of a first type and having respective gate, second and third terminals;
a second FET of said first type and having respective gate, second and third terminals;
a third FET of said first type and having respective gate, second and third terminals;
a fourth FET of said first type and having respective gate, second and third terminals;
a first load; and
a second load,
wherein
the second terminal of the first FET is connected to the first supply rail,
the third terminal of the first FET and the second terminal of the second FET are connected to the output terminal,
the third terminal of the second FET is connected to the second supply rail,
the gate of the third FET and the gate of the fourth FET are connected to the input terminal,
the third terminal of the third FET is connected to the second supply rail,
the first load is connected between the first supply rail and the second terminal of the third FET,
the second load is connected between the third terminal of the fourth FET and the second supply rail,
the gate of the second FET is connected to a node between the second terminal of the third FET and the first load such that a voltage at the second terminal of the third FET is applied to the gate of the second FET, and
the gate of the first FET is connected to a node between the third terminal of the fourth FET and the second load such that a voltage at the third terminal of the fourth FET is applied to the gate of the first FET.

24. A NAND circuit comprising a circuit in accordance with claim 23, a first NAND input, A, a second NAND input, B, fifth and sixth FETs of said first type, and a third load, wherein said output terminal is arranged as an output of the NAND circuit, said third load is connected between the first supply rail and a second terminal of the fifth FET, A is connected to the gate of the fifth FET, B is connected to the gate of the sixth FET, the second terminal of the sixth FET is connected to the third terminal of the fifth FET, the third terminal of the sixth FET is connected to the second supply rail, and said input terminal is connected to the second terminal of the fifth FET.

25. A NOR circuit comprising a circuit in accordance with claim 23, a first NOR input, A, a second NOR input, B, fifth and sixth FETs of said first type, and a third load, wherein said output terminal is arranged as an output of the NOR circuit, said third load is connected between the first supply rail and a second terminal of the fifth FET, A is connected to the gate of the fifth FET, B is connected to the gate of the sixth FET, the second terminal of the sixth FET is connected to the second terminal of the fifth FET, the third terminals of the fifth and sixth FETs are connected to the second supply rail, and said input terminal is connected to the second terminal of the fifth FET.

26. A quad NAND circuit comprising four NAND circuits, each in accordance with claim 20.

27. A buffer circuit comprising a circuit in accordance with claim 23, wherein said input terminal is arranged as an input of the buffer circuit and said output terminal is arranged as an output of the buffer circuit.

28. A HEX buffer circuit comprising six buffer circuits, each in accordance with claim 27.

29. A flip-flop circuit comprising at least one inverter circuit in accordance with claim 10 and at least one NAND circuit.

30. A quad clock divider comprising four flip-flop circuits, each in accordance with claim 29.

31. A circuit in accordance with claim 2 wherein the first load comprises at least one of: a polarising load; a resistor; an enhancement load; an N-type enhancement load; a depletion load; and an N-type depletion load.

32. A circuit in accordance with claim 2 wherein each load comprises at least one of: a polarising load; a resistor; an enhancement load; an N-type enhancement load; a depletion load; and an N-type depletion load.

33. A circuit in accordance with claim 2 wherein the circuit is flexible.

34. Apparatus comprising signal processing means including at least one electronic circuit in accordance with claim 2.

35. An electronic circuit in accordance with claim 23, wherein said first type is NMOS, each said second terminal is a drain terminal, and each said third terminal is a source terminal.

36. An electronic circuit in accordance with claim 23, wherein said first type is PMOS, each said second terminal is a source terminal, and each said third terminal is a drain terminal.

37. An electronic circuit in accordance with claim 23, wherein each FET comprises a respective channel connecting the respective second and third terminals.

38. An electronic circuit in accordance with claim 2, wherein said first type is NMOS, each said second terminal is a drain terminal, and each said third terminal is a source terminal.

39. An electronic circuit in accordance with claim 2, wherein said first type is PMOS, each said second terminal is a source terminal, and each said third terminal is a drain terminal.

40. An electronic circuit in accordance with claim 2, wherein each FET comprises a respective channel connecting the respective second and third terminals.

\* \* \* \* \*